(12) United States Patent
Selmo

(10) Patent No.: US 10,170,093 B2
(45) Date of Patent: Jan. 1, 2019

(54) PREAMPLIFICATION SYSTEM FOR AN ACOUSTIC GUITAR OR OTHER MUSIC INSTRUMENT WITH VIBRATING PARTS

(71) Applicant: HEART SOUND ITALY S.R.L., Verona (IT)

(72) Inventor: Antonio Selmo, Verona (IT)

(73) Assignee: HEART SOUND ITALY S.R.L., Verona (IT)

(*) Notice: Subject to any disclaimer, the term of this patent is extended or adjusted under 35 U.S.C. 154(b) by 0 days.

(21) Appl. No.: 15/310,895

(22) PCT Filed: May 12, 2015

(86) PCT No.: PCT/IB2015/053486
§ 371 (c)(1),
(2) Date: Nov. 14, 2016

(87) PCT Pub. No.: WO2015/173732
PCT Pub. Date: Nov. 19, 2015

(65) Prior Publication Data
US 2017/0084262 A1    Mar. 23, 2017

(30) Foreign Application Priority Data

May 12, 2014 (IT) .............................. MI2014A0856

(51) Int. Cl.
*G10K 15/08* (2006.01)
*G10H 1/00* (2006.01)
(Continued)

(52) U.S. Cl.
CPC ............. *G10H 3/182* (2013.01); *G10H 3/143* (2013.01); *G10H 3/185* (2013.01); *G10H 3/186* (2013.01);
(Continued)

(58) Field of Classification Search
CPC . H03G 5/025; H03G 5/04; H03G 3/04; H04R 17/00
(Continued)

(56) References Cited

U.S. PATENT DOCUMENTS 3,624,264 A    11/1971 Lazarus
7,304,232 B1   12/2007 Nicholes
(Continued)

FOREIGN PATENT DOCUMENTS

WO    2004/023454 A    3/2004
WO    2011/003148 A1   1/2011

OTHER PUBLICATIONS

Jarmo Lahdevaara: "The Science of Electric Guitars and Guitar Electronics", Jan. 1, 2012 (Jan. 1, 2012), Helsinki, Finland, pp. 1,2,237-241, XP055160817, ISBN: 978-9-52-286420-8, [retrieved on Jan. 9, 2015].
(Continued)

*Primary Examiner* — George C Monikang
(74) *Attorney, Agent, or Firm* — Young & Thompson

(57) ABSTRACT

A sound detection system of a musical instrument with vibrating parts includes at least a pair of sensors and a preamplification unit for processing the signal output from the two sensors along respective channels. At least one of the pair of sensors is a piezoelectric transducer and the other one of the pair of sensors is a different-type transducer. The preamplification unit includes, for each channel, an input stage, including an amplifier circuit and an equalization circuit, and an output stage including at least a weighted adder circuit and at least two volume controls with arbitrary logarithmic response curve. At least the input stage for the channel of the piezoelectric transducer is a charge amplifier circuit and at least one of the other input stages can be configured both as a charge amplifier and as non-inverting
(Continued)

amplifier with high input impedance. The equalization circuit includes an RC circuit.

20 Claims, 19 Drawing Sheets

(51) Int. Cl.
    *H03G 3/00*         (2006.01)
    *G10H 1/043*      (2006.01)
    *G10H 3/18*        (2006.01)
    *G10H 3/14*        (2006.01)
    *H03F 3/183*      (2006.01)
    *H03F 3/45*        (2006.01)
    *H03F 3/70*        (2006.01)
    *H03G 3/20*        (2006.01)

(52) U.S. Cl.
    CPC .......... *H03F 3/183* (2013.01); *H03F 3/45475* (2013.01); *H03F 3/70* (2013.01); *H03G 3/20* (2013.01); *G10H 2220/395* (2013.01); *G10H 2220/471* (2013.01); *G10H 2220/531* (2013.01); *G10H 2220/565* (2013.01)

(58) Field of Classification Search
    USPC ........................................ 381/61–62, 65, 118
    See application file for complete search history.

(56) References Cited

U.S. PATENT DOCUMENTS

2004/0105560 A1    6/2004  Naniki
2008/0310654 A1* 12/2008  Jambor ................. H03G 5/025
                                        381/120

OTHER PUBLICATIONS

Dual Channel Pro Preamp, Jul. 8, 2013 (Jul. 8, 2013), XP055211270, Retrieved from the Internet <URL:https://web.archive.org/web/20130708223434/http://kksound.com/pdf/dualchannelpro.pdf> [retrieved on Sep. 4, 2015].
International Search Report, dated Sep. 25, 2015, from corresponding PCT application.

* cited by examiner

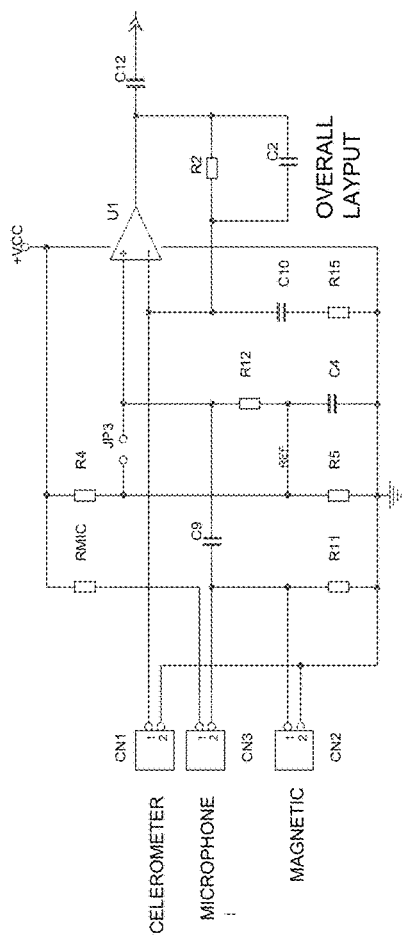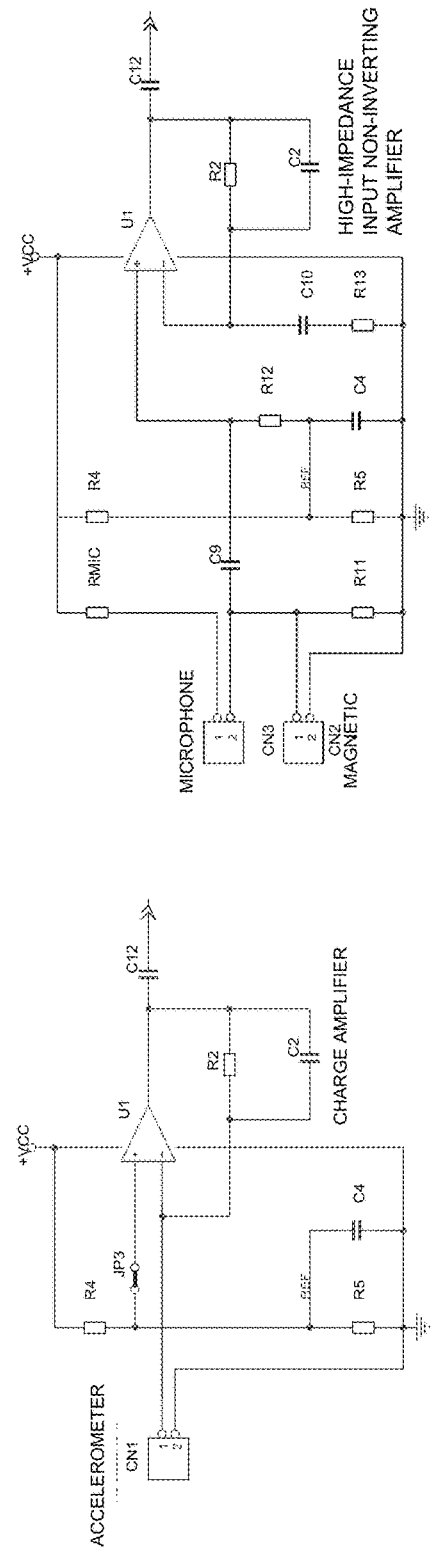

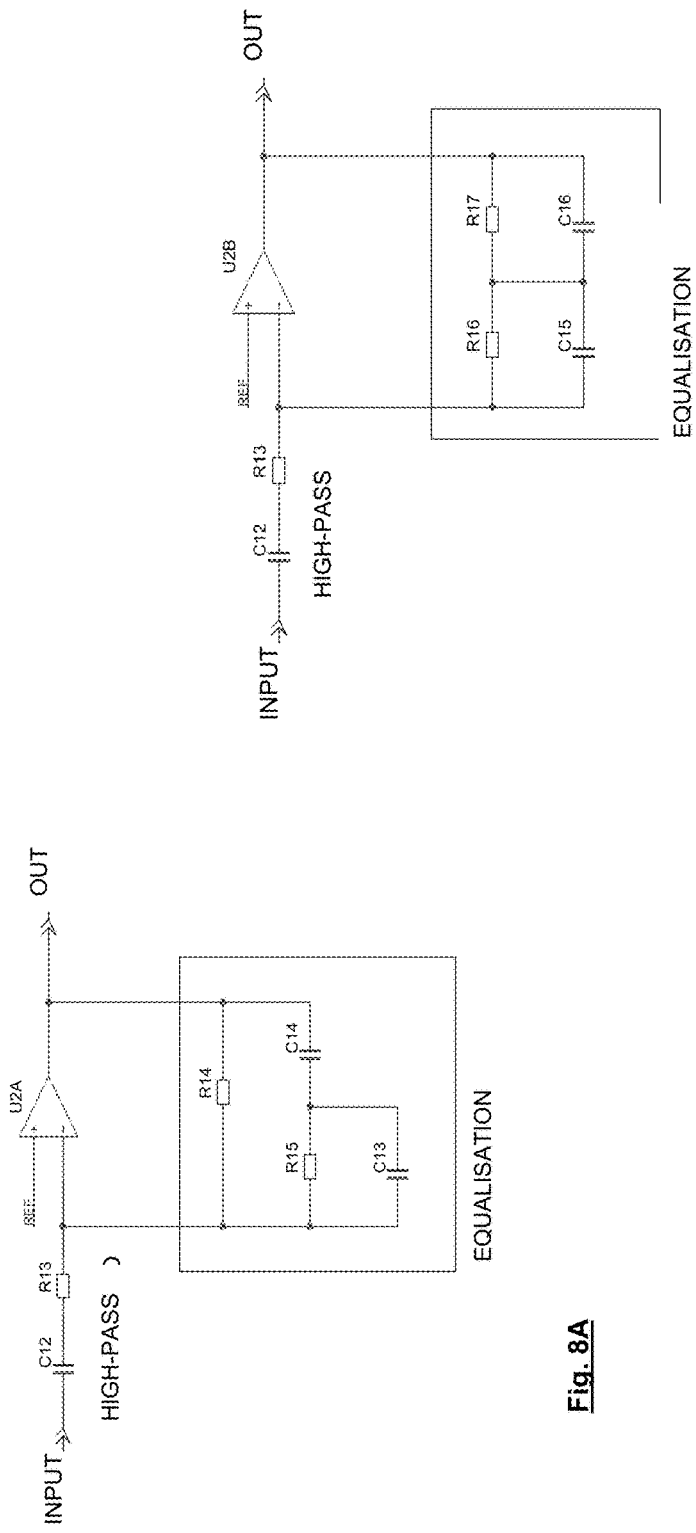

PREAMPLIFICATION SYSTEM FOR AN ACOUSTIC GUITAR OR OTHER MUSIC INSTRUMENT WITH VIBRATING PARTS

FIELD OF THE INVENTION

The present invention relates to a preamplification sound system for an acoustic guitar or other string or vibrating-part musical instrument, in particular a preamplification system with two or more sound sensors.

BACKGROUND ART

As known, a string musical instrument, such as an acoustic guitar or a violin, has a remarkable sound richness, depending on the construction features of the sound board which derive also from the fine skill of the lute maker which produces them. The acoustic power supplied directly by an instrument can be modulated by the music maker, but it cannot go beyond a certain level and in the cases of sonorisation of large indoor or outdoor spaces, it is certainly insufficient. From here the need to amplify the acoustic signal of the instrument.

A traditional system for amplifying volume is that of placing a microphone in front of the instrument and hence amplifying the sound with conventional amplifying equipment. This solution is not always satisfactory, because it is affected by microphone and environment quality, in addition to being prone to the problem of the Larsen effect, due to the return of the acoustic signal into the microphone, precisely in situations of great amplification; moreover, the microphone is able to pick a limited dynamic of the sound which comes out of the instrument, in addition to being strongly affected by environmental acoustics and by the microphone position with respect to the instrument.

Somewhat better results are obtained by positioning special microphones on the mouth of the sound board, below the strings. However, this solution is not fully satisfactory either.

In order to improve the quality of the acquired sound, freeing oneselves from the use of acoustic microphones sensitive to changes of acoustic pressure, it has also already been suggested to use special pickups (acquisition sensors), of the type found on electric guitars.

The pickups used in string instruments (guitars and double basses) are substantially of two types.

A first one is of a magnetic type and comprises a series of single or double coils of metal wire, which generate a magnetic field due to the presence of permanent magnets: this type of pickup is arranged in the proximity of the metal strings of ferromagnetic material, so that the magnetic field is "disturbed" by the vibration of the metal strings and the extent of this change is acquired as electric signal (the technical term is "variable-reluctance"). This signal detects well the vibrations of the strings which move in front of the pickup, but is unable to significantly appreciate any resonance of an acoustic board, which provides the timbre of a certain instrument.

A second one is of the piezoelectric type and comprises a piezoelectric pressure sensor: it is positioned below a bridge, for detecting the direct or resonance vibration in terms of variable pressure, consequent to the mechanical action of the strings vibrating on the support bridge. The nature of the signal acquired with this sensor, as can be guessed, is profoundly different from the one obtained with a magnetic pickup.

In order to acquire a signal from a piezoelectric transducer, it is normally resorted to preamplification circuits with a high input impedance, such as the schematised ones in the attached FIGS. 1A and 1B.

A first exemplifying circuit structure (FIG. 1A) is obtained through Q1 and Q2 and defines a discrete-component amplifier stage with a high input impedance, obtained with the use of a FET (Q1) in a bootstrap configuration. The second circuit structure (FIG. 1B) is obtained by means two operational amplifiers and defines an amplifier with a high input impedance. In both cases the circuits are adequate as voltage amplifiers.

With known electronic configurations, no perfect adaptation of the input stages towards the piezoelectric transducers is obtained and a significant reduction of signal quality is determined in case of parallel connection of multiple piezoelectric transducers. Moreover, since the mixing between signals coming from different, jointly-used transducers is critical, in the prior art no optimisation of the logarithmic response curve of the individual level controls for each signal is provided.

In order to supply an amplified sound as faithful as possible to the natural one, it has also been suggested to simultaneously acquire the signal deriving from multiple different sensors, arranged on a same acoustic instrument. WO2004/023454, for example, discloses a preamplification system for a pair of sensors arranged, on an acoustic instrument, one below a bridge for detecting the direct vibrations of the strings, and one on the instrument sound box, for detecting resonance vibrations. WO2011/003148 discloses a similar system, wherein a third sensor in the shape of a microphone is also provided.

Both these prior-art systems, however, still have significant management problems of the different signals. As a matter of fact, in the light of the different nature of the signals produced by the various sensors, as well as the different nature of the acquired sound (direct vibration, resonance vibration, acoustic wave in the air, . . . ), problems of electronic processing of the signals in the preamplification stage exist, to then obtain the correct output signal to be amplified in the final stage, without distorsions, without spectrum limitation of the signal, and having a final sound as natural as possible. It must be observed, moreover, that the magneto-dynamic inertia sensors have limited responses in frequency, remarkable mass and high sensitivity towards external electromagnetic fields, especially those at network frequency and harmonic frequencies thereof.

Finally, it must be considered that the reduced space available on the musical instrument also makes critical the physical configuration of the preamplifier which must be of excellent quality as well as having high immunity to electromagnetic fields of external sources.

U.S. Pat. No. 7,304,232 discloses a joystick gain control system for the amplification of a string instrument. Two equal magnetic-type or piezoelectric-type pickups are provided, with the volume potentiometers directly connected to the pickups. Such configuration in actual fact does not allow to obtain a good response from piezoelectric-type sensors, because it would require a load resistance of a few M$\Omega$, necessary in order not to load the sensor, which would imply an alteration of the frequency response upon the varying of the potentiometer cursor position. Moreover, a change of the equivalent resistance seen from the piezoelectric sensor would imply a change of the frequency response on the low part of the spectrum (equivalent to a sort of response of a high-pass filter at variable frequency). The volume control is arranged between the pickups and the amplification stages.

The structure is that of a generic amplification system, volume adjustment of a passive type and tone control, but it cannot be understood what the inner structure and the circuitry in the active version are. The volume controls are carried out directly on the sensors, changing the response thereof, increasing the equivalent electric noise thereof due to the additional resistance of the potentiometer circuit, virtually allowing the use of sole low-impedance sensors; an analogic→digital and digital→analogic chain is furthermore accomplished, obtaining the volume and tone adjustment functions numerically. The phase inversion of either one of the two sensors is obtained through an electromechanical-type switch (a double deviator with crossed connections).

In the document Jarmo Landevaara: "The Science of Electric Guitars and Guitar Electronics" some amplification circuits for a piezoelectric sensor are disclosed. This prior-art solution does not offer an ideal amplifier in the application considered by the present invention yet, because it is a FET impedance-adapter, follower circuit.

SUMMARY OF THE INVENTION

In view of the above, an object of the present invention is that of providing a preamplification system with at least two sound acquisition sensors, one different from the other, which can be used on string instruments, both acoustic and solid-board ones (electric guitars), for correctly acquiring and processing the instrument sound, so as to provide as output, after one or more amplification and equalisation stages, a sound as natural as possible, corresponding to the acoustic sound of the instrument.

Said object is achieved through a system as defined in claim 1.

The dependent claims illustrate further preferred and advantageous features according to the invention.

BRIEF DESCRIPTION OF THE DRAWINGS

Further features and advantages of the system according to the invention will in any case be more evident from the following detailed description of a preferred embodiment of the same, given as an example and illustrated in the attached drawings, wherein:

FIG. 7A is a circuit diagram of an input stage of a variable-configuration amplifier, according to a preferred embodiment of the invention;

FIGS. 7B and 7C represent two different configurations of the circuit of FIG. 7A, a charge amplifier and a voltage amplifier, respectively;

DETAILED DESCRIPTION OF A PREFERRED EMBODIMENT

The present invention starts from the principle of using different types of sensors of physical quantities such as pressures, torques, accelerations, in a combined manner, suitably processing the corresponding signals so as to obtain an amplified sound as true and natural as possible.

Figure 1B:
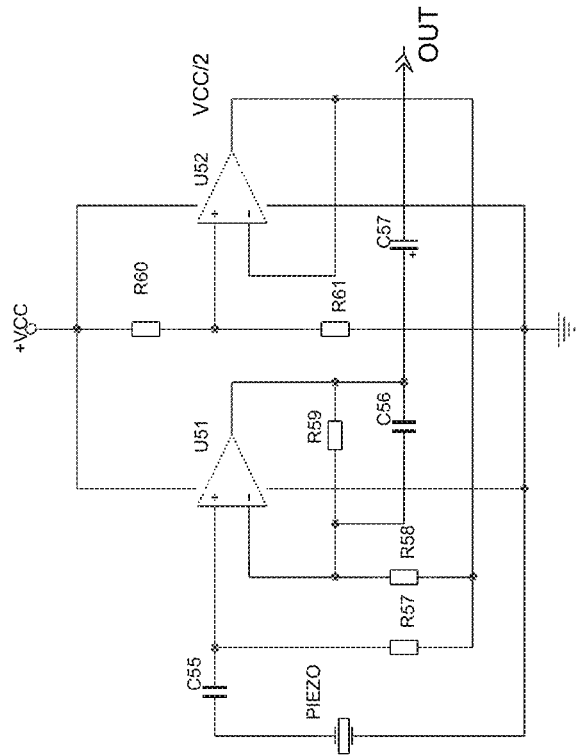
FIGS. 1A and 1B are prior-art circuit diagrams of voltage amplifiers.
Figure 1A:
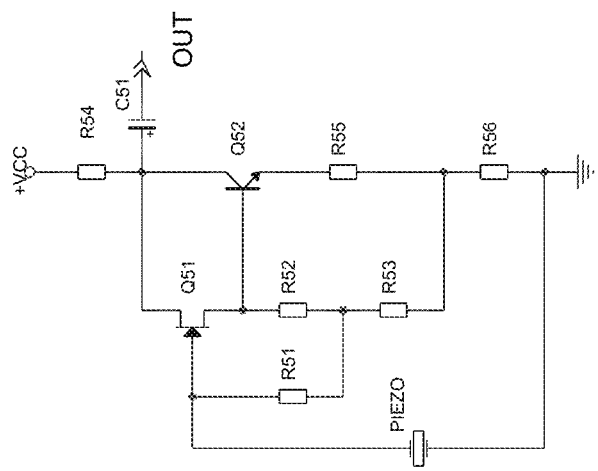
Figure 2A:
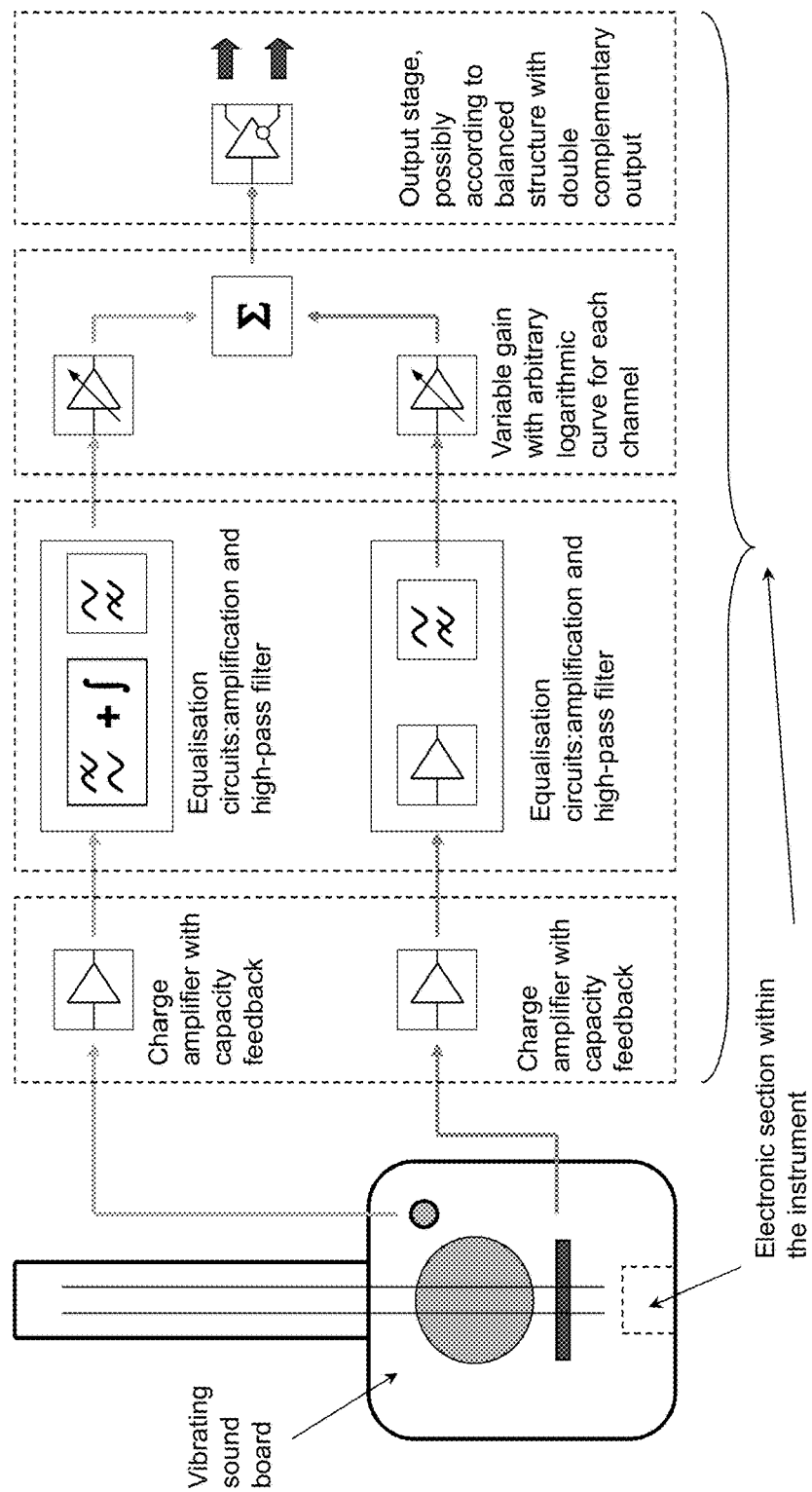
FIGS. 2A and 2B are schematic views of an acoustic guitar provided with the system according to two different embodiments of the invention, provided with piezoelectric sensors below the bridge and accelerometric, piezoelectric sensors on the sound board.
Figure 2B:
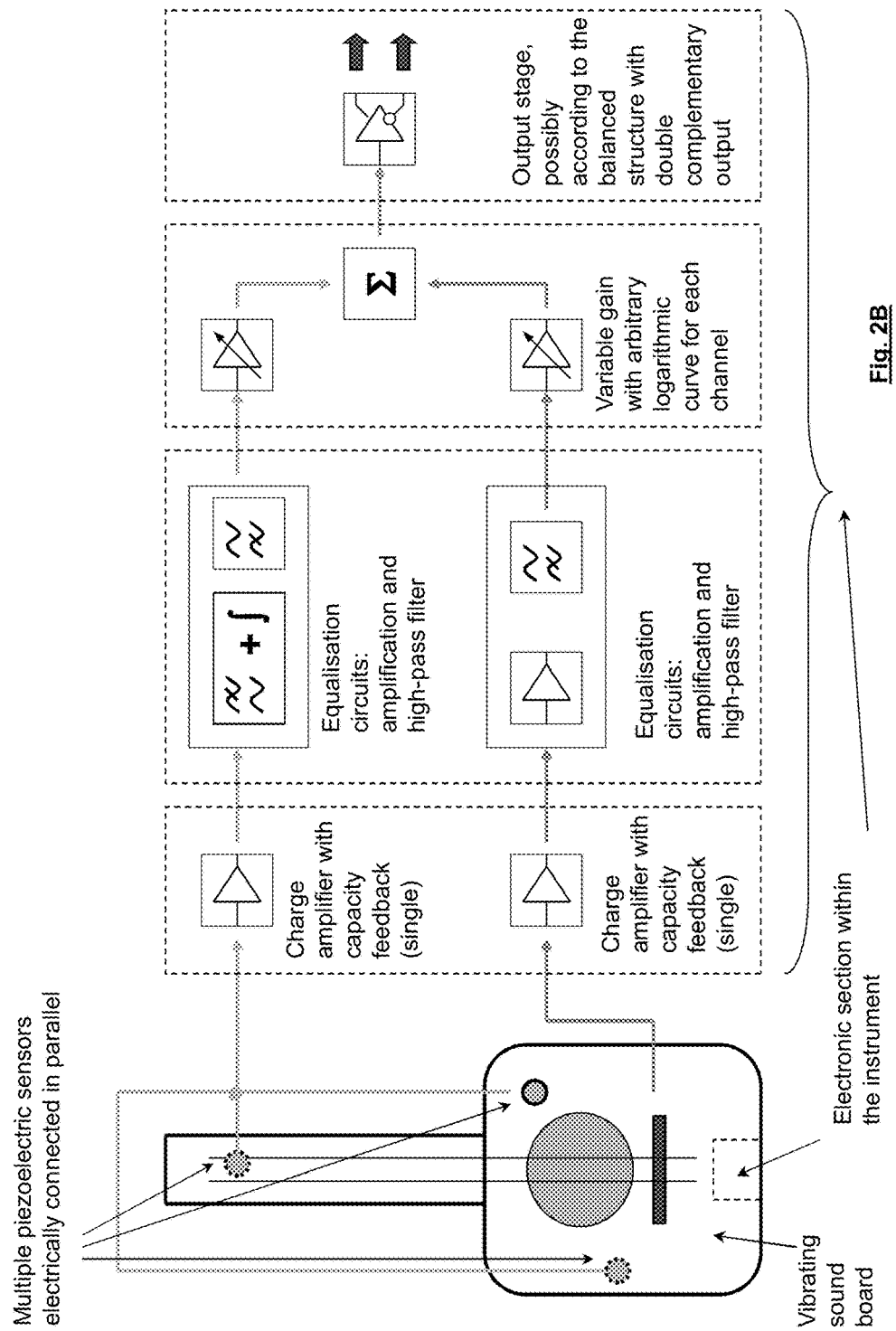
Figure 2C:
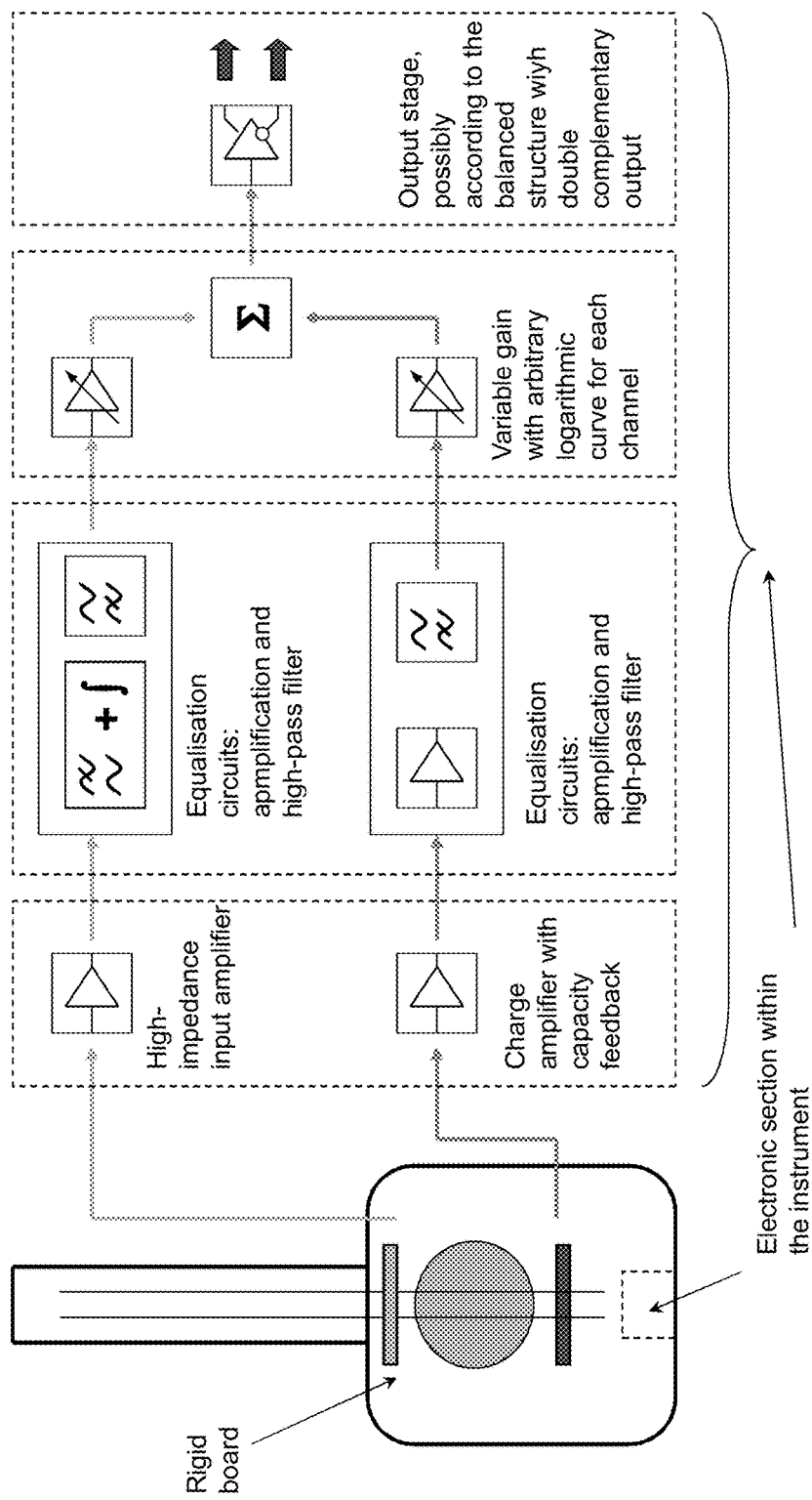
FIG. 2C is a schematic view of a rigid-board guitar provided with the system according to a third embodiment of the invention provided with a piezoelectric sensor below the bridge and with a magnetic sensor below the metal strings.
Figure 3:
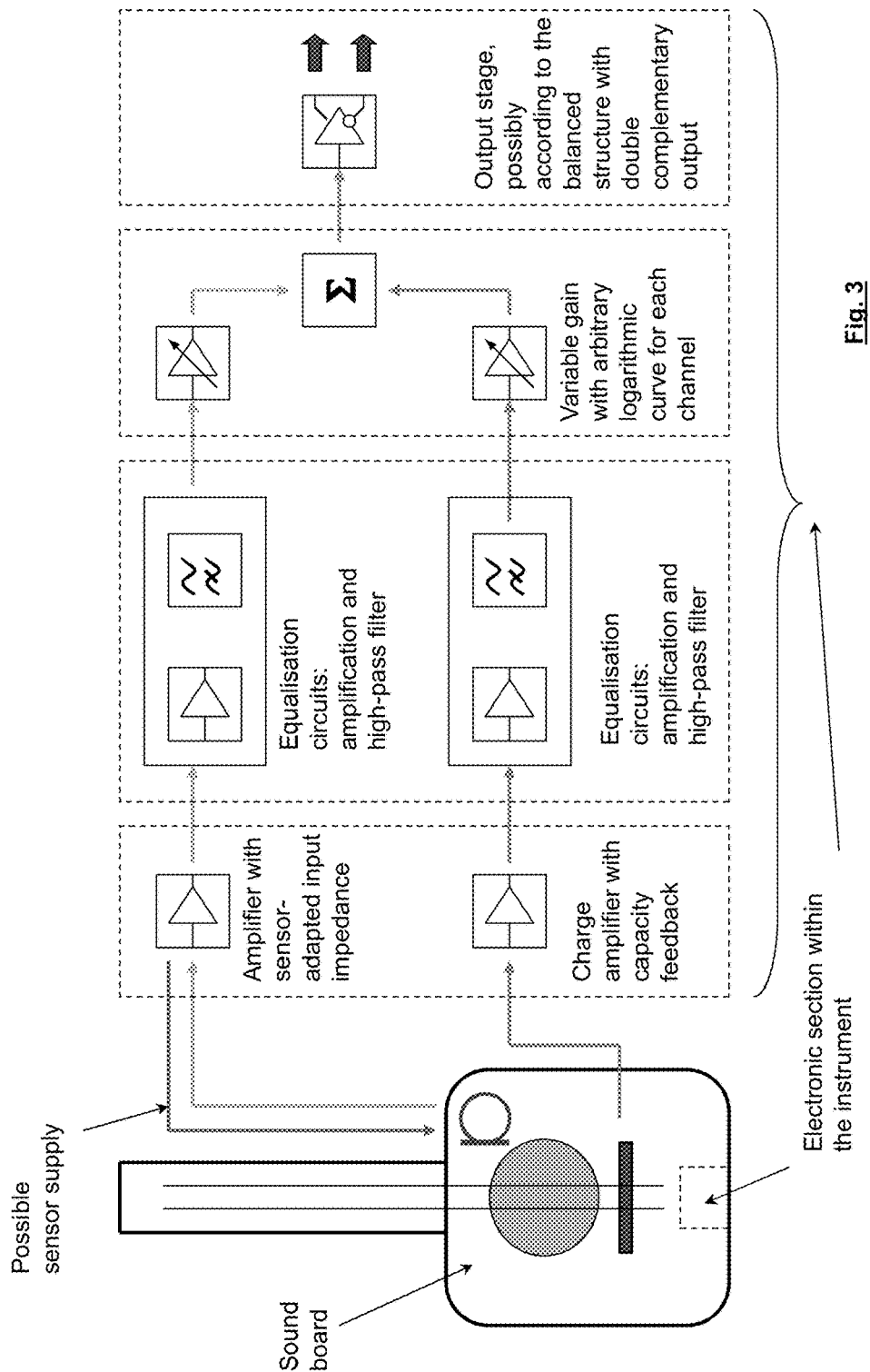
FIG. 3 is a schematic view of an acoustic guitar provided with the system according to a fourth embodiment of the invention, provided with piezoelectric sensor below the bridge and microphone within the sound board.

FIGS. 2 and 3 illustrate two embodiments of the invention, wherein two different string musical instruments are schematically illustrated (an acoustic guitar and a rigid-board electric guitar, respectively), provided with two sensors with the relative (schematically drawn) amplification, equalisation, addition and output stages.

At least one of the sensors is a pressure transducer, configured for being directly affected by the force imparted by the vibrating strings on the sound board (whether acoustic or rigid).

The other sensor may be an acceleration transducer, that is, a transducer sensitive to the acceleration of the sound board or of any other vibrating part of the instrument, where it is positioned.

Alternatively, the second sensor may be a magnetic transducer (with variable reluctance or variable magnetic field, in case of vibration of ferromagnetic components of the instrument).

The balancing of the signals obtained from these two different sensors produces an electric signal which corresponds to the acoustic sound of the instrument, with also the timbre nuances which meet the music-maker's needs, being able to vary the extent of the mixing of the signals coming from the different sensors.

The different sensors (transducers from physical quantity to electric quantity) take up dramatically distinct functions, depending on their positioning and their interaction with the detected physical quantity. In the following the various features thereof are disclosed.

Pressure Transducer, Arranged Below the Bridge.

It is capable of acquiring the sound produced directly by the pressure of the strings on the bridge of the string musical instrument; the fundamental feature thereof is a very short onset time, it has a response which is little linked to the acoustics of the sound board of the instrument and is sensitive to the type of strings and to finger picking intensity. Directly subject to bridge pressure, which is released onto the sound board, such transducer transforms into electric signal (electric charge) the string stresses. The sound corresponding to the electric signal is extremely sharp and clean, with very wide dynamics which makes the onset incisive but extremely natural at the same time.

According to an aspect of the invention, such transducer is configured so as to have a flexible sensitive element of a very reduced thickness (0.2-0.3 mm), so as to perfectly fit to any type of bridge, without having to act mechanically with complex bodywork interventions on the musical instrument.

In practice the installation thereof provides to: removing the bridge from the instrument, after having loosened the strings, inserting the transducer into the groove which makes up the bridge housing, hence covering again the sensor with the bridge, which is arranged in the same position as before the sensor insertion; finally the strings are tensioned again to obtain the original tuning. Before the insertion a small hole must be practised on one side of the groove, to allow the passage of the tiny coaxial cable which connects the piezoelectric sensor to the electronic section.

Construction Structure of the Transducer Positioned Below the Bridge

This transducer consists of a multi-layer, piezoelectric film, manufactured with a technique which guarantees the intrinsic shielding thereof from external electric fields. The structure thereof (FIGS. 13A-13C) consists of two piezoelectric films separated by a conductive sheet, which makes up the "hot" pole thereof. The two piezoelectric sheets are externally covered by two mutually connected conductive sheets, which make up the "cold" pole thereof. The hot pole is connected to the central conductor of the coaxial cable connecting it to the electronic section, while the cold pole is connected to the braided wire of the coaxial cable connecting it to the electronic section. Such structure accomplishes a self-shielding piezoelectric transducer, of a very reduced thickness (a few tenths of mm). Due to the mechanical features thereof, the application thereof is particularly simple and quick and requires no digging of the bridge seat in the instrument.

Figure 13A:
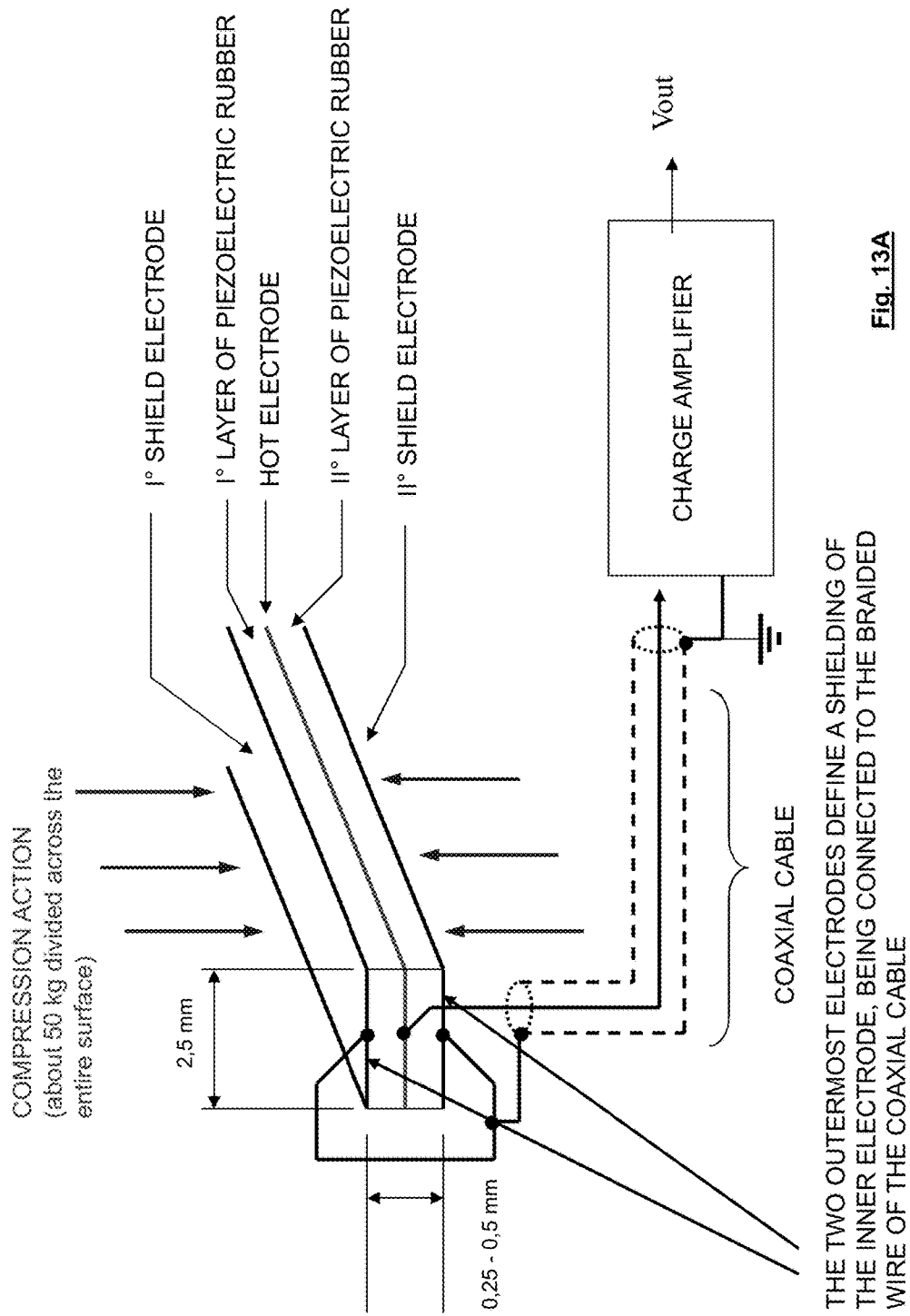
FIGS. 13A, 13B and 13C are schematic cross-section views of the structure of an exemplifying piezoelectric sensor according to the invention.
Figure 13B:
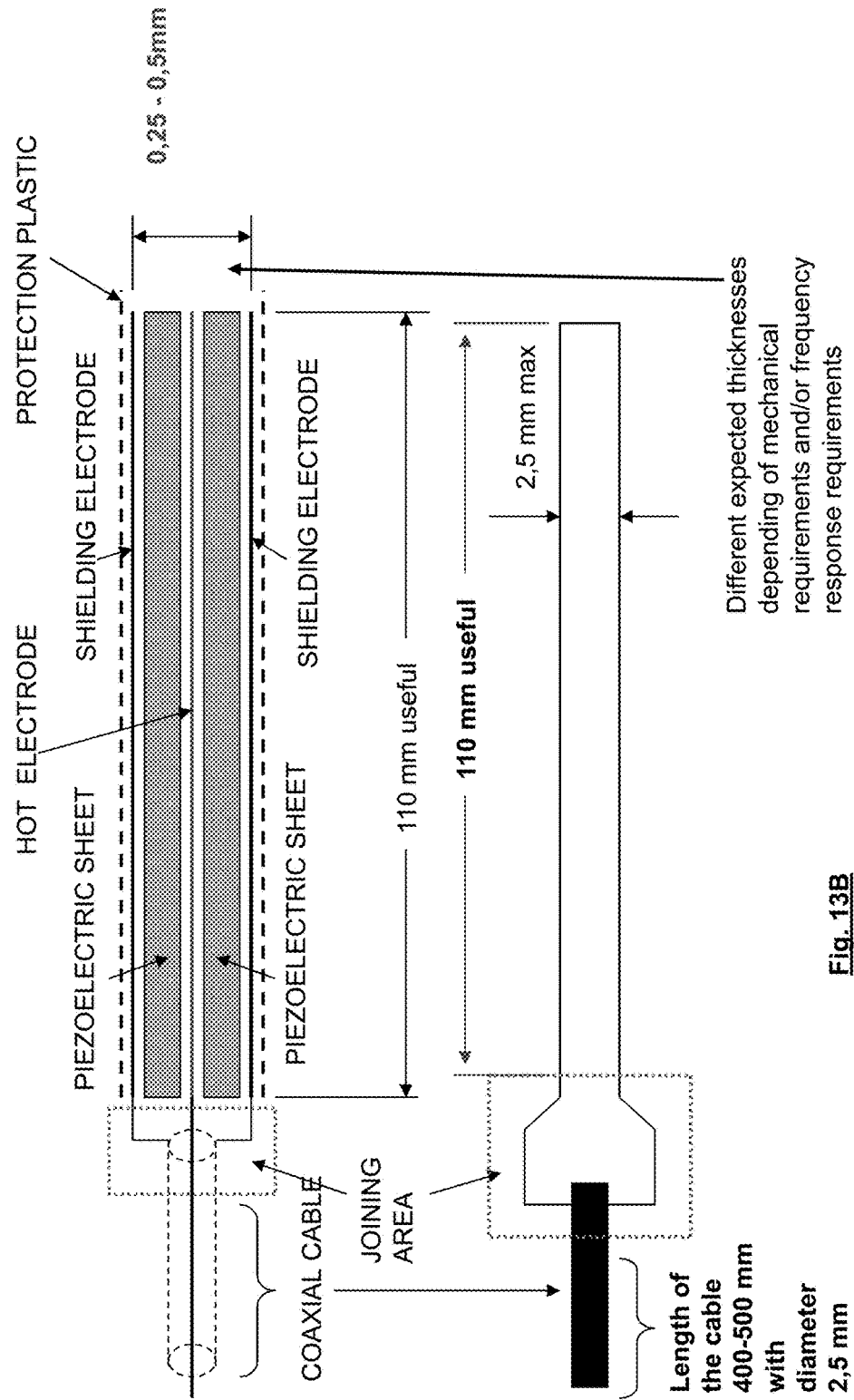
Figure 13C:
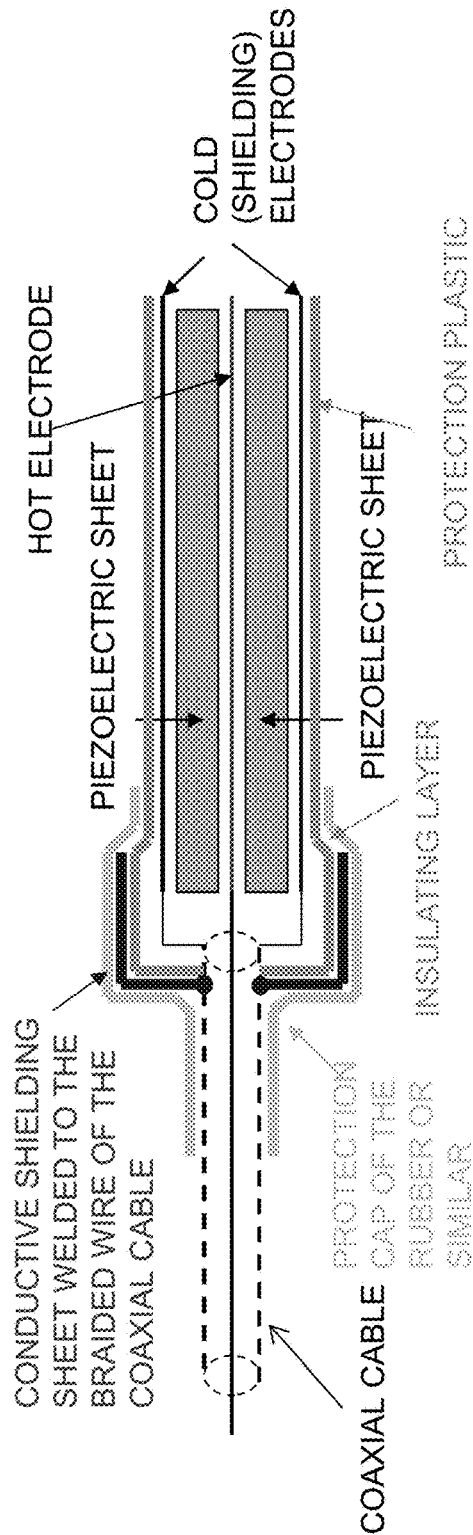

The exemplifying measures indicated in FIGS. 13A-13C account for the size of the device which can be housed below the bridge of a guitar without particular bodywork interventions. It is nevertheless understood that the sizes may change significantly also depending on the specific application of the sensor.

Acceleration Transducer, Mounted on the Instrument Box

It is capable of acquiring the sound which propagates in the sound board and reveals the acoustic features. The presence of such transducer allows to acquire a signal which is strongly affected by the instrument acoustics and hence represents a sort of instrument "signature".

It is an accelerometric sensor which transduces vibrations into electric signal (electric charge). Since the acceleration represents the speed derivative, in order to obtain a signal corresponding to the "true sound" of the instrument, which is instead related to the speed of the vibrations of the sound board, an operation like an integration (pole function+zero) before supplying the output signal is performed on the acquired signal.

An exemplifying accelerometric sensor suitable for the purpose consists of an inertial mass fastened to a piezoelectric elastic support, with possible dampening material in which the vibrating device is embedded. The acceleration which the device undergoes is transmitted to the piezoelectric elastic support which supports the inertial mass, thereby obtaining the transduction from acceleration to electric charge.

Due to the use of an accelerometric sensor of a very reduced mass (below 1 gram), there is no need to firmly glue such sensor to the sound board of the instrument, but it is sufficient to fasten it with a low-tenacity (pressure sensitive), easily removable adhesive. Such solution advantageously enables the user to reposition multiple times the sensor as he/she prefers, so as to empirically identify the best position for reaching the best realism of the electric signal towards the natural acoustic sound.

Preferably, the accelerometric transducer is arranged so as to be able to be rotated by 180 degrees (for example by repositioning or providing a mounting capsule which allows the inversion of the two faces with respect to the plane of the board of the musical instrument): that allows to change the signal phase, hence to compensate the phase between the signals of the different sensors, possibly necessary for compensating interference and elision problems of the composite signal obtained from the sum of the signal with signals coming from other sensors.

As a matter of fact, the signal obtained from the accelerometric sensor significantly depends on the sensor position on the sound board. In order to be able to obtain in output a signal as realistic as possible, that is, corresponding as much as possible to the acoustic signal which propagates by air, it is necessary to try to obtain a signal as similar as possible to the one obtained through an airborne microphone; the analysis which allows to verify the reaching of such condition may be carried out combining the time analysis of the trend of the sound intensity with the frequency analysis which shows the development of the different sound components of the two signals obtained by the invention and by an airborne microphone. From that derives the advantageous opportunity to easily reposition the accelerometric sensor into different positions on the sound table, until obtaining an adequate (time and frequency) correspondence of the two signals. Moreover, please notice that the joint use of a pressure sensor below the bridge and of the accelerometric sensor arranged on the sound table, differently arranged, can lead to elision problems, especially for the lower part of the acoustic spectrum, due to the counterphase sum of the two signals. For such reason, as seen above, the accelerometric sensor also provides the opportunity to be rotated by 180° in its greater-sensitivity axis.

The remarkable versatility of this sensor allows to apply the device in practice in all the instruments which have a vibrating part (for example pianos, harpsichords and the like) and even in all those applications where there is the need to amplify the acoustic signal generated by the vibration of boards, or other elements.

The sensor used has been obtained starting from a standard manufactured sensor, introducing a series of structural changes which have allowed to obtain decidedly improved performances with respect to the initial version. The first implemented change relates to the removal of the internally integrated electronic section, consisting of a FET impedance-adaptor stage and not of a charge amplifier. The second implemented change relates to a conductive structure fully shielding from external electric fields. The third implemented change relates to the exit way of the coaxial cable from the sensor structure, which guarantees high mechanical sturdiness towards traction stresses which the cable may undergo during rearrangement operations.

Magnetic Transducer, Mounted Below the Strings

This sensor transforms the ferromagnetic material string displacement into an electric signal. The timbres are those typical of a traditional "magnetic pick-up" but, due to a suitable amplification and equalisation circuit (which is illustrated below), with a decidedly wider spectrum and a minimal alteration of the timbres.

As mentioned above, in the case of absence of vibrating sound boards, as in the case of rigid-board instruments (electric guitar), the accelerometric sensor on the board would lose meaning and is hence replaced by this magnetic sensor sensitive to the vibration of the strings made of ferromagnetic material, according to the variable reluctance principle. According to the invention, such sensor is interfaced at a first amplification stage which is followed by an equalisation stage (1 pole+1 zero up to a maximum of 2 poles+2 zeroes), to compensate the fact that the output of such type of sensors is proportional to the speed of variation of the magnetic flow generated by the displacement of the strings and not by the actual sound associated with such displacement. By doing so, the frequency response obtained by such transducer is wider than the one which would be obtained connecting it to an amplifier through only passive components, due to a perfect adaptation between such type of transducer and the input electronic circuit.

Here in the following the electronic section provided downstream of the sensors is now described. It may be housed in physical units arranged inside the musical instrument sound board, preferably at a short distance from the sensors. The particular structure of the input stages of the electronic section allows to accomplish the connection between sensors and electronic section even of a considerable length (above a meter), without losses or signal alteration due to the connection leads.

In the case of simultaneous action of multiple sensors, preferably the mixing level of the two different signals coming from the sensors is not set in a fixed manner, but is adjustable by the user. Such adjustment occurs by manually acting on two or more potentiometers easily accessible by the user, integral with the electronic part or remote, connected through a shielded multipolar cable (the shielding is advisable but not essential, the values of the potentiometers being only of a few kilo ohms, hence little sensitive to external electromagnetic fields). As a matter of fact it is preferable to give the music-maker the opportunity to create their "own sound", not obtained with effects, external equalisations or other signal manipulation, but rather mixing at pleasure the signals coming from the different sensors, with the opportunity of fixing (through preliminary adjustment) the maximum level of each signal, to obtain a sort of optimal mixing "preset".

The amplification stage is configured so as to best adapt to each sound detection sensor.

The Piezoelectric Transducer

The piezoelectric transducer supplies an electric charge proportional to the stresses it undergoes. Therefore, according to the invention, the input stage for the piezoelectric transducer is obtained with the charge amplifier technique, through an inverting stage with charge-feedback operational amplifier.

The piezoelectric sensor, arranged below the bridge, requires no signal equalisation, because a virtually linear response across the entire acoustic spectrum and beyond is shaped.

In the case of a signal coming from an accelerometric sensor, as indicated in FIG. 2, the respective amplification channel is followed by an equalisation circuit consisting of an RC circuit and an almost-integrator (polo+zero response). The corresponding response to the function of "almost integrator" makes up a standard resulting from the impossibility of accomplishing a pure integrator which, ideally consisting of a single pole of the first order at zero frequency, would lead to an infinite amplification for the continuous component. In practice, a circuit is accomplished which works as a real integrator starting from a frequency greater than zero (consequent to the fact that the feedback network is obtained from the parallel of a capacity and of a resistance and not of a capacity only). In the case of the invention there is a further variant with respect to the real integrator, since the addition of a zero in the frequency response is provided, such as to interrupt the integration action at medium-high frequencies, replacing it with a constant amplification action upon the frequency change. That is the result of tests carried out, which have highlighted how an integration action without additional zero in the frequency response would lead to a signal, obtained from the accelerometric chain, poor of high-frequency components.

The Magnetic Transducer

The transducer of a magnetic type supplies a voltage linked to the speed of variation of the magnetic field. The input stage for magnetic transducers is accomplished with the technique of the high-input-impedance, non-inverting amplifier. Also for such type of sensor the first stage is followed by an equalisation circuit consisting of an RC circuit and of an equalisation network (with a response polo+zero up to 2 poles+2 zeroes), to compensate the fact that the output of such type of sensors is proportional to the variation speed of the magnetic flow generated by the string displacement and not by the actual sound associated with such displacement.

The Accelerometric Sensor

The accelerometric sensor supplies an electric signal (electric charge) proportional to the acceleration it undergoes. The input stage for such sensor consists of a charge amplifier, which accomplishes the best possible interface towards such type of transducer. In order to move from an acceleration-linked signal to a speed-linked signal (as it must be in order to supply a correct sound representation), the first amplification stage (charge amplifier) is always followed by an equalisation circuit consisting of an RC circuit and an almost integrator (pole+zero response).

The Microphone Sensor

In the case of particular situations the opportunity of using as sensor an acoustic microphone (FIG. 3), or similar, sensitive to pressure variations, is provided. The opportunity of using non-powered, for example magneto-dynamic, microphones, or powered ones, such as capacitor microphones with integrated conditioning electronics exists. The input stage which can be configured according to different structures allows to use different-type microphones.

In practice, according to the invention, one of the two employed sensors is certainly piezoelectric, connected to a stage which is a charge amplifier, without the opportunity of other configurations. The second transducer is connected to the second amplification stage which, in this case, may be configured both as charge amplifier and as non-inverting amplifier with high-input-impedance. For such reason the second transducer may be both of a piezoelectric nature, and of another nature with the output either in voltage or in current. The circuit with the frequency response of "almost integrator" may be present, should there be the need (in the case of accelerometric sensors) or it may lack or supply a response of a linear type (or other type, given the opportunities offered by the feedback network) in case the second transducer has an already adequate frequency response with no need for any equalisation.

According to a preferred embodiment of the invention, the electronic unit on board the instrument thus has such a configuration as to make the operativeness of the first amplification stage flexible. It is accomplished so as to be able to be easily converted from charge amplifier to non-inverting amplifier with a high-input-impedance, and vice versa, simply mounting some components rather than others and/or varying the value of components mounted for both circuits. In practice a single electronic board is designed with the technique of the printed circuit, where the housings for all components are prepared, both the ones mounted for accomplishing the charge-amplifier structure, and the ones mounted for accomplishing the non-inverting amplifier structure with high-input-impedance. The two different configurations are obtained mounting only the components relating to each configuration. Some components are mounted for both configurations, but can be of different value for each configuration. That allows a saving linked to the fact that with a single support electronic board it is possible to accomplish different conditioning electronics, adapted to different types of sensor.

In the non-inverting amplifier configuration with high-input-impedance, it is suited also for other types of transducers, in addition to magnetic ones.

The third stage of the preamplification unit is an adder circuit, in particular a weighted adder with logarithmic response and maximum-gain adjusting circuit.

The circuit for obtaining the perfect mixing of the two signals is accomplished through an inverting weighted adder with operational amplifier, for obtaining the maximum possible linearity, together with a pass bandwidth which does not depend on the gain set for each of the two branches to which the signals to be summed are applied.

In order to optimise the adder adjustment by the user, an adjustment circuit is provided, defined by resistive-type trimmers, which sets the signal level, for each channel, when the corresponding volume potentiometer is at its maximum. It is a sort of maximum-level "preset" for each channel, presettable by the user.

Preferably, this adjuster section of the variable adder is conceived to be remote with respect to the electronic section of the adder and connected through a thin shielded multi-wire cable. That allows to arrange the volume control device, depending on requirements, up to a distance of over 100 cm from the electronic section of the preamplification unit.

The response curve obtained, upon the varying of the position of the small control knob, is of the logarithmic type, manufactured with linear-type potentiometers and additional resistors. Such solution allows to obtain an absolutely repetitive logarithmic-type curve, due to the good linearity of the linear potentiometers, and virtually arbitrary, depending on the ratio between the value of the potentiometer resistance and of the load resistance connected to the potentiometer cursor, such as to meet any music maker's or other user's adjustment requirements.

The circuit structure employing an inverting weighted adder through operational amplifier allows to multiplex the circuit by an arbitrary number of times: in other terms, that allows to mix the signals coming not only from two channels, but potentially from any number of channels. In this stage, the electronic circuit is used as a sort of master unit, on which the signals converge coming from the amplification stages of other electronic parts. That opens to a potentially even more extended scenario, wherein the mixing opportunities of multiple sensors, arranged in different locations of the instrument, become countless.

The last output stage is at low-impedance, so as to make the quality of the signal applied to the external amplifier not significantly dependent from the input impedance of the external device nor from the length of the connecting cable (between the unit onboard the instrument and the external amplification equipment). Moreover, the output connector is arranged for a differential-type connection with the external amplifier. Thereby the best possible immunity is accomplished towards the disturbing electromagnetic fields at the network frequency of mains.

For such output stage, preferably a circuit with two balanced and mutually complementary active outputs is provided, for obtaining the best possible signal to be sent to a remote, differential-input amplifier.

Finally, the above-mentioned electronic components are installed on a printed circuit board which is arranged within a protection envelope. In particular, said envelope has a mechanical structure which determines full shielding from external electric fields and a highly efficient shielding towards external electro-magnetic fields. That is obtained through a ferromagnetic metal box, which covers the entire electronic section, and a copper-coated plate (typical for printed circuit boards) arranged below the printed circuit; preferably a further copper-plated plate is provided which defines, in addition to the shielding of the weldings of the sensor and volume-adjuster assembly cables, also the mechanical anchoring of the conductors which lead to the plate.

The electric shielding is guaranteed by the shield material which is a good electric conductor (copper and iron, possibly tin-plated) and the magnetic shielding is guaranteed by the shield material with high magnetic permeability (soft iron or, alternatively, magnetic stainless steel).

Coming now to the description of the individual drawings, some solutions relating to the electronic circuits for amplifying signals coming from piezoelectric transducers will be illustrated.

Figure 4:
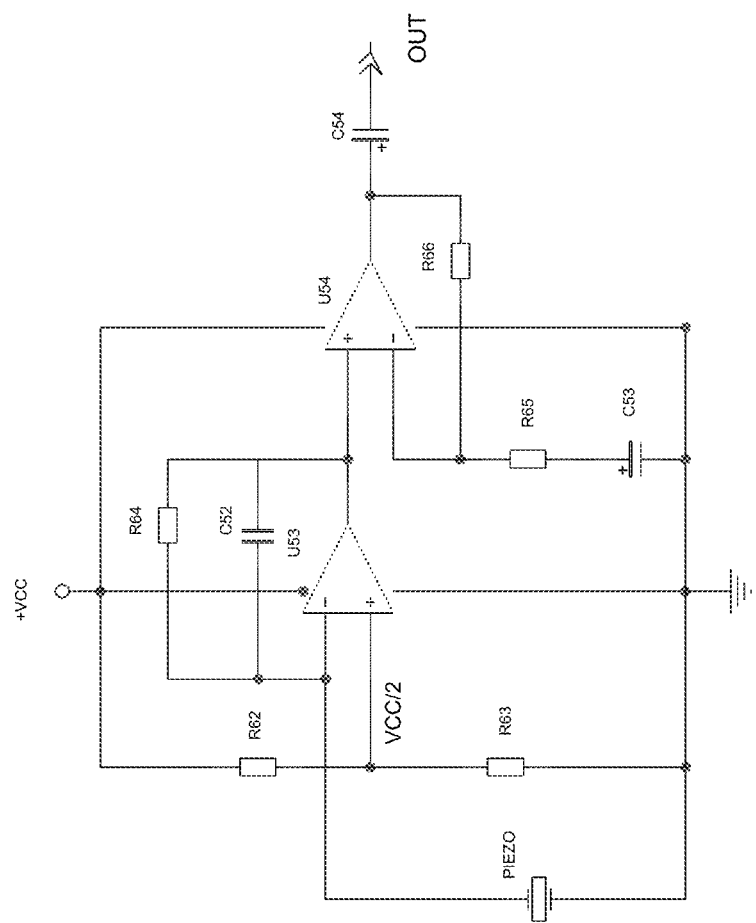
FIGS. 4A, 4B and 4C are circuit diagrams of prior-art amplifiers.

In FIG. 4A a discrete-component circuit is shown, built with the follower technique with FET and transistors in bootstrap configuration and collector output for obtaining an amplification greater than one. A certainly valid circuit as voltage amplifier with high input impedance (obtained through the use of a FET) but not suited as charge amplifier (the charge indeed generated by the piezoelectric transducer).

FIG. 4B shows a circuit with integrated components (operational amplifiers) where U51 accomplishes the high-input-impedance amplification stage while U52 has the purpose of providing a sort of "floating zero" to allow to power the circuit with single supply. The gain depends on the feedback network R58, R59, C56. Also in this case the circuit is certainly valid as voltage amplifier with high input impedance (obtained through an operational amplifier with FET input) but not suited as charge amplifier.

FIG. 4C shows a circuit with integrated components (operational amplifiers) where U53 accomplishes the input stage in charge-amplifier configuration (only in case R64 is of a value decidedly above a few Megaohm), while C52 accomplishes the feedback capacity. No gain variation is provided but acting on the value of capacity C52. The second stage is accomplished by amplifier U54 with the feedback network provided with resistances R66, R65 and capacity C53: it has no significant equalisation, such as to pass from a piece of information relating to acceleration to a piece of information relating to speed.

Figure 5:
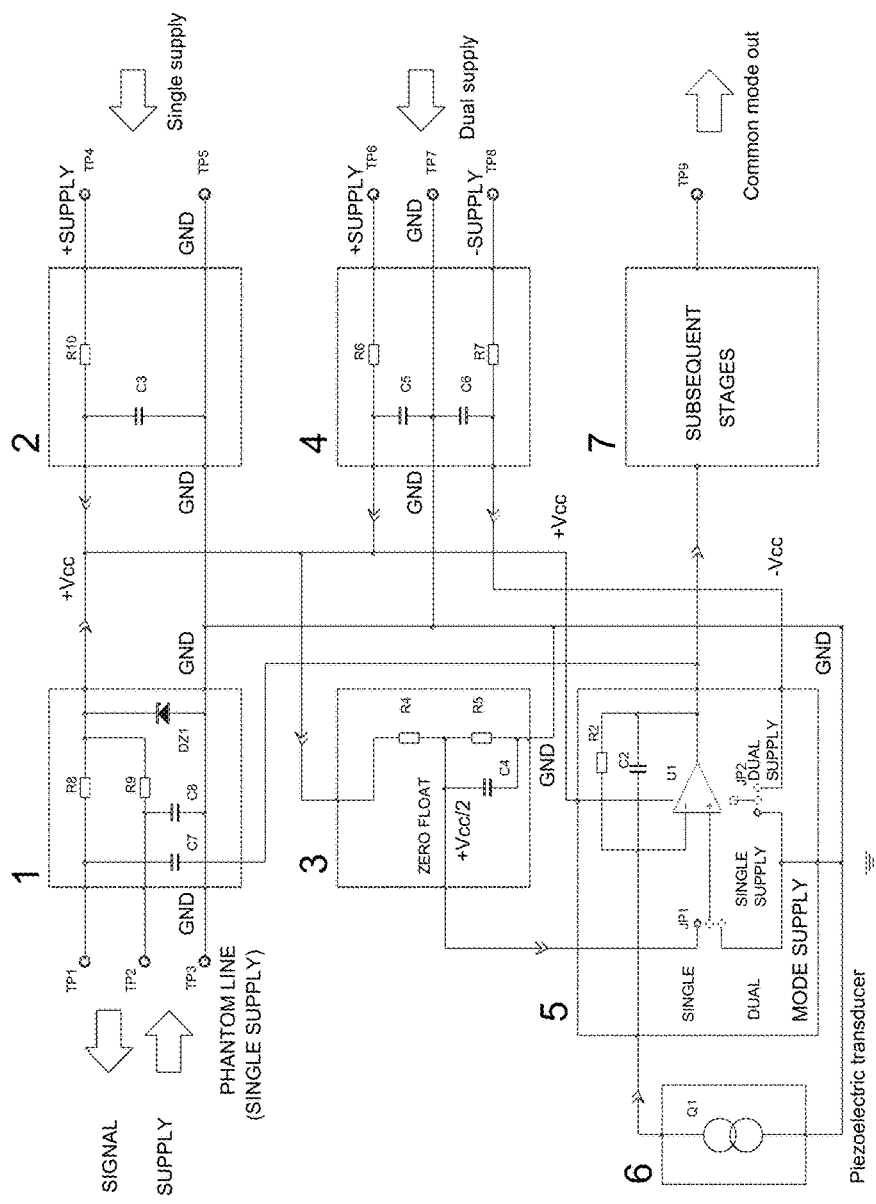
FIG. 5 is a circuit diagram of an entire supply system according to an embodiment of the invention.

FIG. 5 shows different circuit structures relating to the electric power supply of the electronic unit, depending on the type of supply adopted.

Block [1] allows to power the unit through a conventional "phantom"-type system, used in all professional amplification systems. Capacity C7 (of a value ranging between hundreds of nF and a few µF) transfers the signal, capacity C8 (of a value similar to C7) accomplishes the pseudo-differential configuration, zener diode DZ1 (of a value ranging between 12V and 30V) limits power tension. The one-way-and-two-position selectors JP1 and JP2 are to be arranged as single supply.

Block [2] allows instead to power the unit with single supply both locally (for example with a battery with voltage from 6 to 24V), and remote (continuous voltage with values ranging between 6 and 30 V).

The block [3] consisting of resistances R3, R4 (of values ranging between a few kΩ and some tens of kΩ) and of capacity C4 (of the value of a few hundreds nF) simply accomplishes a divider towards the single supply voltage. The voltage thus obtained, of a value around half the supply tension, accomplishes the so-called "floating zero" which allows to the amplifier stages to operate around the optimal rest point, consisting indeed of half the supply tension, which guarantees the greatest possible excursion of the output voltage from the amplification stages together with a good operation linearity. Such block is necessary only in case of single supply.

Block [4] allows to power the device with dual supply both locally (for example two batteries with voltage from 6 to 24V), and remotely (continuous dual voltage with values between the positive voltage and the negative one ranging between 12V and 30V). Resistances R6 and R7 (of the value of a few tens of Ω) with the capacities C5 and C6 (of the value of a few hundreds of nF) accomplish a low-pass filter for any RF disturbances along the power line. An advantage of such a type of power supply lies in the opportunity of coupling the various stages in continuous current, obtaining a bandwidth on the low part of the spectrum until continuous current. The coupling in continuous current can be obtained due to the opportunity of deleting the coupling capacities between the output of a stage and the input of the next one, each stage operating around zero. Thereby the transfer function of the high-pass type resulting from the use of the coupling capacities is replaced by a transfer function with a gain which remains constant until zero frequency.

A further advantage, resulting from the dual-type power supply, consists of the greatest possible excursion of the output voltage and by the absence of block [3] necessary, instead, for obtaining the floating reference (explained above) in the case of non-dual power supplies.

Block [5] is the actual amplification stage, connected to the piezoelectric transducer (in the illustrated embodiment), which can be set with single or dual supply through the two one-way-and-two-position selectors JP1 and JP2.

Figure 6:
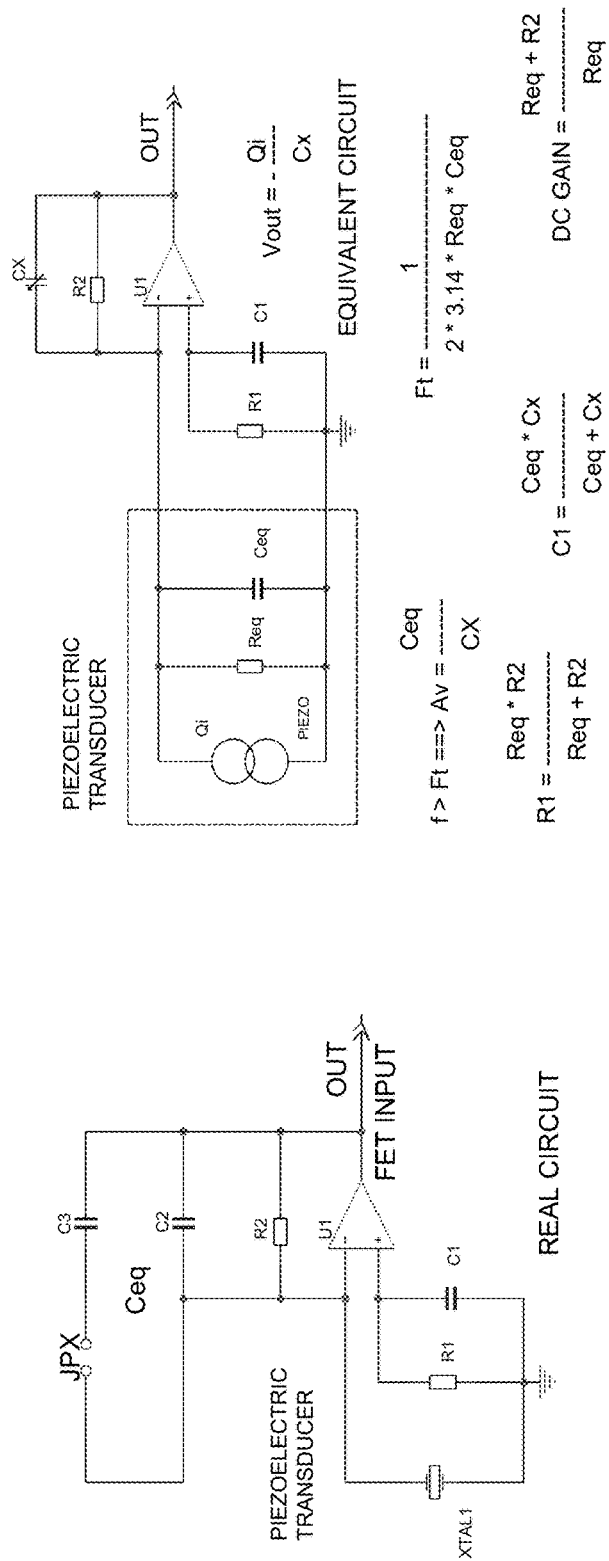
FIG. 6 is a circuit diagram of the input stage, in a variable-gain, charge amplifier configuration, according to the invention.

FIG. 6 represents in detail the input stage of the charge amplifier. It is an charge amplifier circuit accomplished with capacity-feedback operational amplifier. Through contact JPX it is possible to vary the charge transduction sensitivity in tension. As an example, by doubling the feedback capacity transduction constant dV/dQ is halfed. In the equivalent diagram (shown on the right hand side) the variable feedback capacity is referred to as CX. In both diagrams, the pair consisting of resistance R1 and of capacity C1 is not strictly required, but only advisable in the case of charge amplifier used with accurate measure transducers (calibrated accelerometric sensors). In the equivalent diagram the sensor is shown as a charge generator.

In FIGS. 7A-7C the variable-configuration input stage is shown. Such input stage is structured so as to be able to be mounted in different ways, depending on the required function. The object of such configurability is the obtainable saving, being able to make available different circuits starting from a single support (printed circuit board PCB). The overall configuration (FIG. 7A) shows all the components used in the two possible configurations: charge amplifier and non-inverting amplifier with high input impedance, or with controlled impedance with the opportunity of power supplying a possible condensator microphone with integrated electronics. Both the indicated configurations are suited to single supply. With a structure virtually of the same kind it is possible to obtain the same results for dual supply.

In the charge amplifier configuration (FIG. 7B), contact JP3 is closed and a feedback network consisting of resistance R2 and of capacity C2 is substantially capacitive (R2 of a very high value 10 MOhm-22 M ohm, with product C2·R2 such that 1/(6.28·C2·R2) is smaller than the minimum circuit operation frequency. Resistances R3 and R5 (of a value ranging between some kΩ and some tens of kΩ) accomplish the floating reference.

In the non-inverting amplifier configuration (FIG. 7C), resistance R11 (of a value ranging between some kΩ and some MΩ) accomplishes the load directly connected to the sensor (in the exemplifying case considered, the sensor is of a magnetic type). Resistances R4 and R5 accomplish the floating reference. Resistances and capacities R2 and C2, R5 and C5 accomplish the feedback network with R2 having a remarkably lower value than in the case of the charge amplifier. The feedback is dominated by R2, while C2 defines only one pole in the frequency response in the high part of the spectrum. In case a microphone is used, there is the opportunity of using unpowered microphones (in such case the input connector for the magnetic sensor is used) or powered microphones. In the case of microphone with load resistance on the cold pole, the microphone is connected to the connector referred to as MICROPHONE CN3, the resistance R11 (of the order of kΩ) makes up the load and RMIC represents only an in-series resistance to the microphone power supply. In the case of microphone with load resistance on the hot pole, the microphone is connected to the connector referred to as MAGNETIC CN2 and the two poles of the connector CN3 are to be short-circuited. In such conditions resistance R11 must be removed and resistance RMIC makes up the load for the microphone. Capacity C10 and resistance R15 determine the lower cut frequency, determining the frequency given by 1/(6.28·C10·R15) as the frequency value so that the stage gain is reduced to one. Resistance R12 and capacity C9 accomplish a high-pass filter of the first order with cut frequency 1/(6.28·C9·R12), in the case of R12>>R5. The structure thus defined allows to manage the frequency response and the input impedance in a wide excursion field, acting on the value of R11 and R12 for defining the input impedance, on the product value (R2·C2) for defining the upper cut frequency (low-pass function) and on the value of the product (R15·C10) and of the product (R12·C9) for defining the lower cut frequency (high-pass function).

Figure 8D:
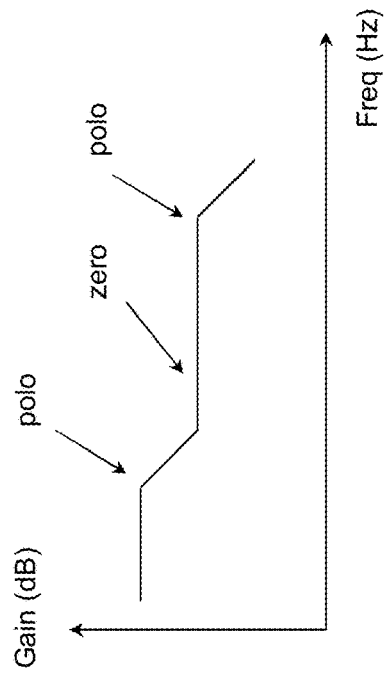
FIGS. 8A and 8B are two circuit diagrams of an equalisation stage, which allow to obtain two different frequency responses, respectively illustrated in FIGS. 8C and 8D.
Figure 8C:
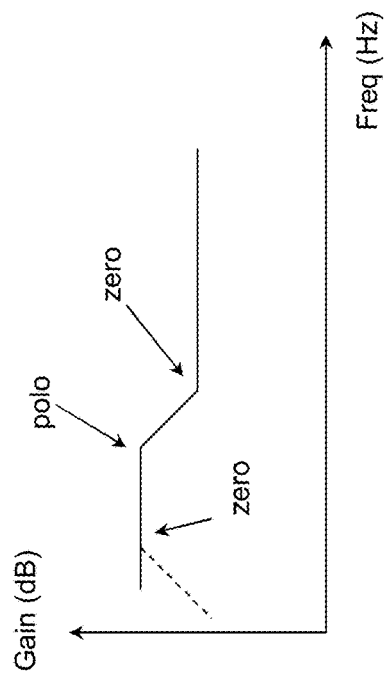

FIGS. 8A and 8B represent two embodiments of the equalisation stage. The reported configurations represent two possible circuit solutions for obtaining different frequency responses. Depending on the values of the resistive and capacitive components it is possible to arrange as desired the poles and the zeroes of the frequency response (see FIGS. 8C and 8D), for meeting the requirements of the specific preamplification circuit. By associating with the feedback network the network RC consisting of capacity C12 and of resistance R13, a high-pass function of the first order is added, essential for removing acoustic problems due to subsonic or low-frequency components. In the case of FIG. 8A capacity C13 (of the value of a few tens of pF) has the purpose of creating a pole in the very high frequency response, so as to reduce the supersonic-frequency noise and increase stability, improving the behaviour in the response to fast transients.

Figure 9A:
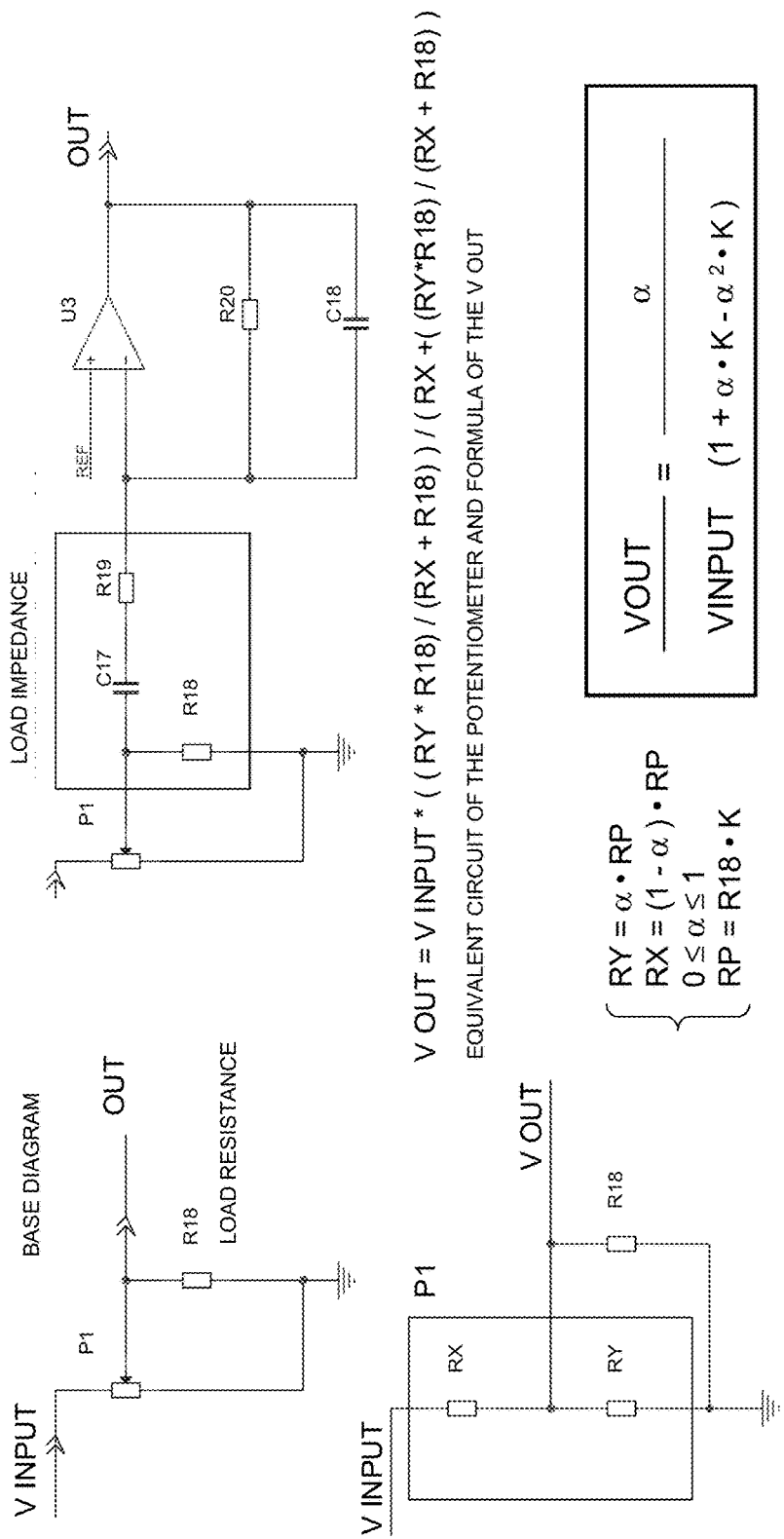
FIG. 9A shows two circuit diagrams, representative of the principle diagram and of the application diagram, of a volume control according to the invention.
Figure 9B:
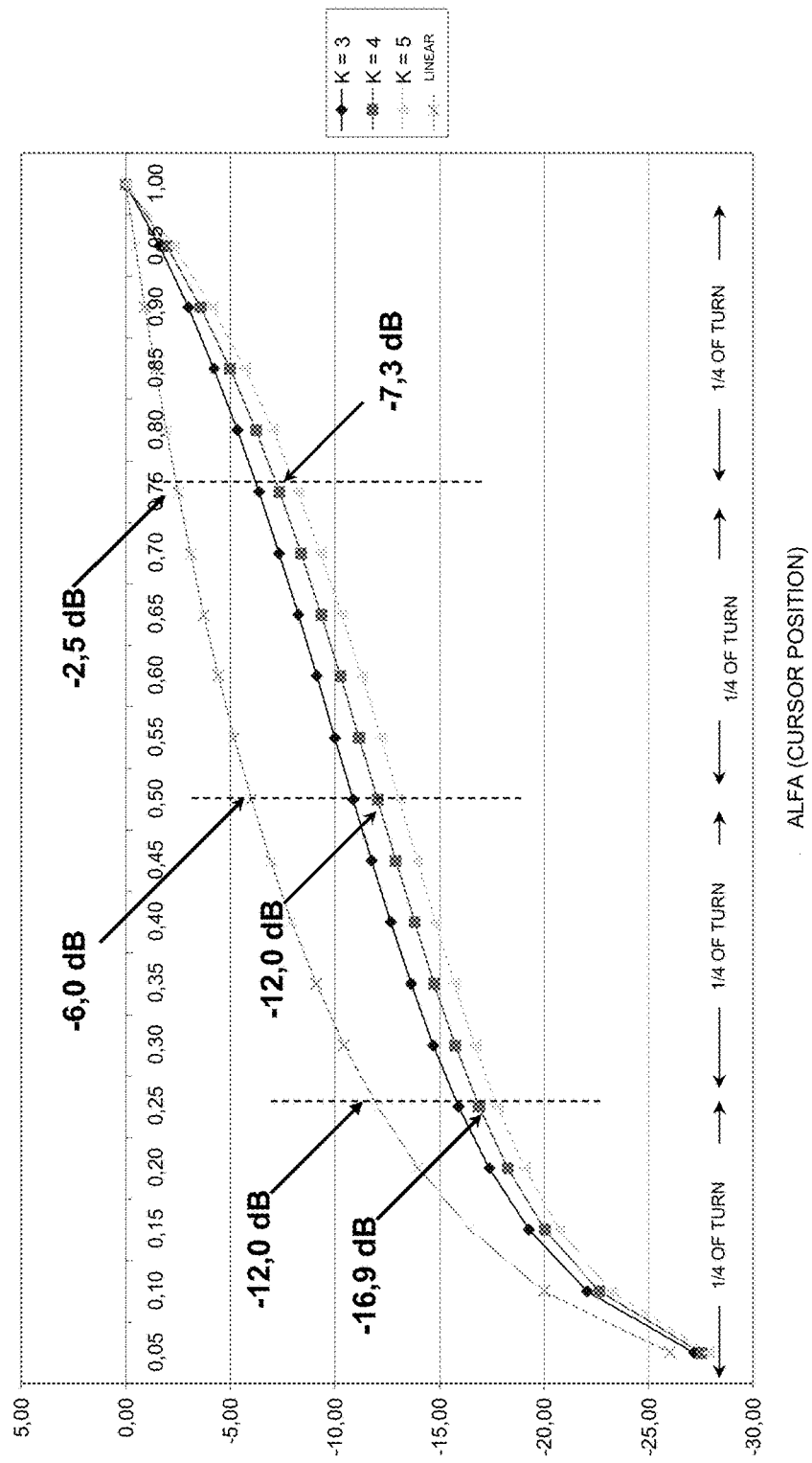
FIG. 9B is a diagram which illustrates the response of the circuit illustrated in FIG. 9A with K=3, 4 and 5 and in the linear case.

FIGS. 9A and 9B schematically show the volume control with logarithmic curve according to the invention. The two configurations reported in FIG. 9A (above and below) represent the principle diagram and the application diagram accomplished in the invention.

Operation is based on the addition, to the simple potentiometric circuit referred to as P1, of a load consisting of a resistance R18, between the cursor of potentiometer P1 and the reference. Depending on the ratio K between the value of potentiometer P1 and resistance R18, a different logarithmic curve is obtained. According to the invention, the preferred chosen values of the ratio K=P1/R18 range from 3 to 5. For the lower values of such ratio a more linear curve is obtained, while with greater ratios a more logarithmic curve is obtained. By removing resistance R18 a linear curve is obtained.

FIG. 9B reports in the diagram the simulation of the intervention of the potentiometer (in terms of rotation a of the cursor thereof with respect to a full revolution of) 360° for the different selected values of K.

The response obtained with the sole potentiometer with linear curve (upper curve) provides that already by the first ¼ of revolution (90° of rotation of the potentiometer knob) one arrives at a level of −12 dB; it is then obtained a variation of 6 dB with the second ¼ of revolution, a variation of 3.4 dB with the third ¼ of revolution and a variation of only 2.5 dB with the last ¼ of revolution. In substance, the variation in terms of dB is concentrated to a large extent on the first two ¼ of revolution (180° of rotation) and is not constant in the subsequent two ¼ of revolution.

Vice versa, the three responses obtained with the selection of the invention (the values highlighted by the arrows refer to the case of K=4) with the first ¼ of revolution produce a level of −17 dB (values ranging between −16 dB and −18 dB depending on the value of K); such value represents a level which begins to be clearly perceivable acoustically, without being a difficult level to be accurately set by the rotation of the potentiometer; in the subsequent ¾ of revolution of the potentiometer it can be noticed how the variation for each ¼ of revolution is rather constant and on average equal to about 6 dB.

From an perceptive acoustic point of view, 3 dB of variation are little perceivable, while 6 dB of variation are clearly perceivable: that means that, in the final ¾ of revolution, the 3-dB variation, which corresponds to a sort of fine tuning of the sound level, it is obtained with a rotation of ⅛ of revolution of the potentiometer, a value which is clearly controllable manually. Therefore, the particular response curve obtained with the configuration choice of the invention, allows to obtain a fine adjustment in the range from −18 dB to 0 dB. Vice versa, using a standard potentiometer with logarithmic curve, no similar result would be obtained.

In the case of application of such circuit to a subsequent amplification stage, to resistance R18 shall be supplemented in parallel with a network consisting of the series of capacity C17 and of resistance R19, which is connected to a virtual-zero point. The pair C17 and R19 determines the high-pass cut frequency, while the pair C18 and R20 determines the low-pass cut frequency.

An advantage of such circuit configuration lies in the opportunity of setting a virtually arbitrary logarithmic curve, starting from a linear potentiometer, notoriously more accurate than a similar logarithmic potentiometer. Moreover, the logarithmic curve thus obtained may be applied both to a clockwise and anti-clockwise rotation of the potentiometer knob, so as to second users' requirements.

Figure 10:
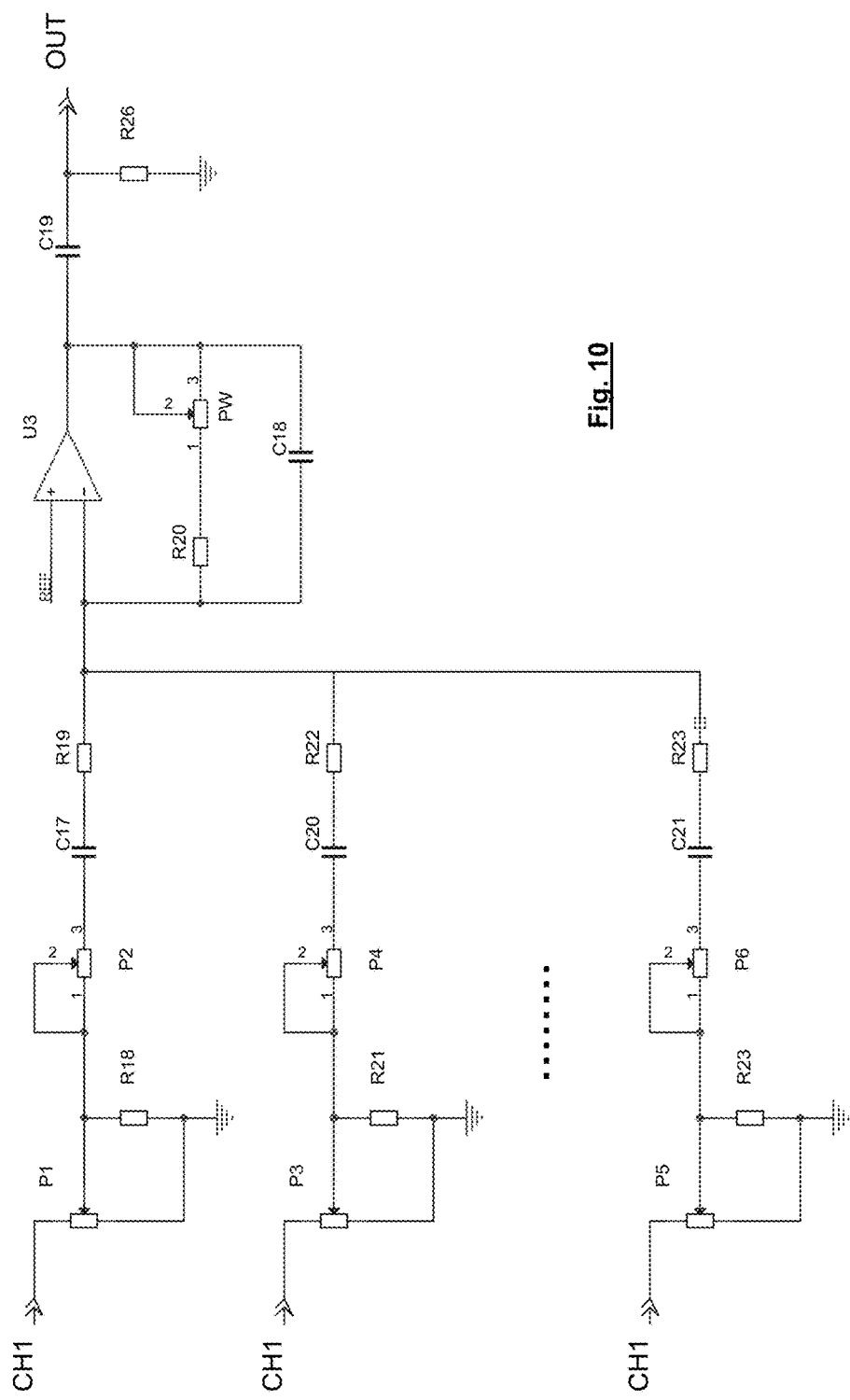
FIG. 10 is a circuit diagram of an adder stage of the signals according to the invention.

FIG. 10 shows a circuit diagram of the adder stage, where the two (or more) channels of the sound transducers converge.

Due to a non-perfect construction repeatability of the transducers and of the different acoustic response of the various instruments, it is necessary to be able to set the maximum level for each of the channels. According to the invention, that is obtained by the addition, in series to each input network RC (C17, R19), (C20, R22), (C21, R23), a resistive trimmer (P2, P4, P6); depending on the value of such resistive trimmer, with respect to the value of the fixed resistance of the corresponding branch RC, a different excursion of the maximum gain value is obtained. Such value may vary between a few fractions of dB and a few tens of dB, thus being able to compensate any transducer and any musical instrument. For example with R19=10 kΩ and P2=5 kΩ a variation of about 3.5 dB is obtained, with R19=10 kΩ and P2=10 kΩ a variation of 6 dB is obtained. In order not to significantly alter the logarithmic curve the following condition must be met: (P2+R19)>>R18, (P4+R22)>>R21, (P6+R24)>>R23, . . . . In any case the modulus of the impedance shown by capacities C17, C20, C21 must be small with respect to the values of resistances R19, R22, R24.

It is thus possible to preset the maximum gain on each channel, before the signal is then added through the (inverting weighted) adder amplifier U3.

When the trimmer is set on the minimum value, maximum gain is obtained and, at the same time, a more specifically logarithmic curve (a situation suited to the adjustment at high volume levels). When the trimmer is set on the maximum value, minimum gain is obtained and, at the same time, an adjustment curve which draws closed to the linear-type curve (a situation suited to the adjustment at low volume levels, where the curve is more linear with respect to the maximum volume condition).

Furthermore, by acting on the value of potentiometer PW, arranged downstream of the various channels, it is possible to jointly vary the gain of all channels, in a perfectly identical manner. Similarly to the input circuits to the adder, such value may vary between a few fractions of dB and a few tens of dB, thus being able to adjust the level of the output signal depending on requirements. For example, with R20=10 kΩ and PW=5 kΩ a variation of 3.5 dB is obtained, with R20=10 kΩ and Pw=10 kΩ a variation of 6 dB is obtained, with R20=10 kΩ and Pw=20 kΩ a variation of 9.5 dB is obtained.

Another significant advantage of this configuration of the invention is given by the opportunity of increasing the number of channels mutually added with no limitation. Multiple distinct modules can also be used and cause the signals to converge onto the same adder module.

Figure 11:
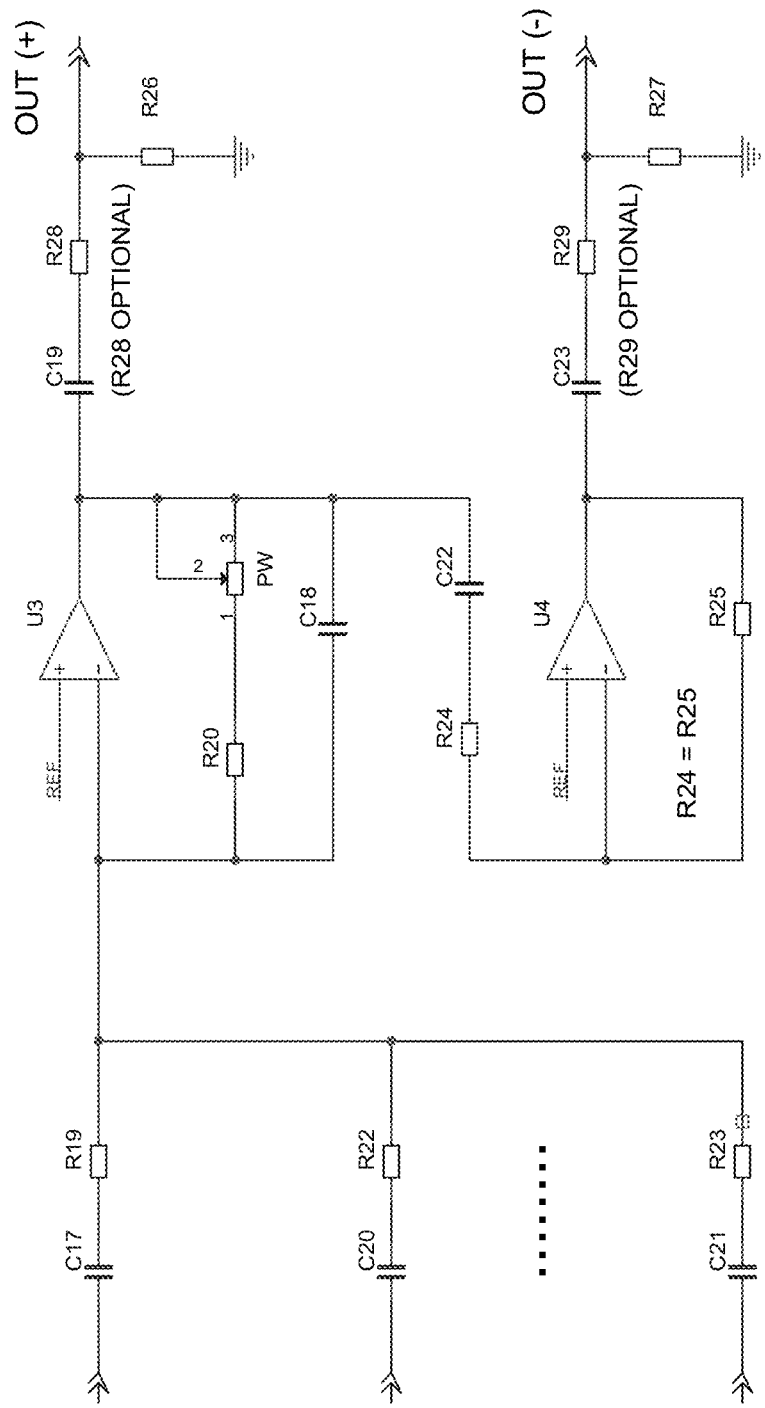
FIG. 11 is a circuit diagram of a balanced output stage according to the invention.

FIG. 11 shows an alternative embodiment to the output stage shown in FIG. 10, wherein the output stage is balanced.

In the case of applications in which the greatest possible immunity in the cable transmission of the signal is required, together with a very low irradiation of electromagnetic field in the proximity of the signal transmission cables, the use of a balanced line with differential receiver is fundamental. According to the invention, the balanced output mode is obtained by adding an inverting stage with unitary gain (U4, R24, C17, R25, with R24=R25) to the output stage integrated in the weighted adder (U3, R20, C18). The two networks C19, R26 and C23, R27 have the purpose of uncoupling from the continuous current the two output signals, mutually complementary. The presence of resistances R26 and R27, of a value of the order of a few k$\Omega$, in addition to preloading capacities C19 and C23, make the frequency response poorly dependent on the input impedance of the amplifier to which the device is connected. Resistances R28 and R29, of a value around the hundred of $\Omega$, have the function of protecting amplifiers U3 and U4 in case of output short-circuit, in addition to avoiding the oscillation due to instability in case of loads with a significant capacitive component, as in the case of long signal cables.

Figures 12A, 12B:
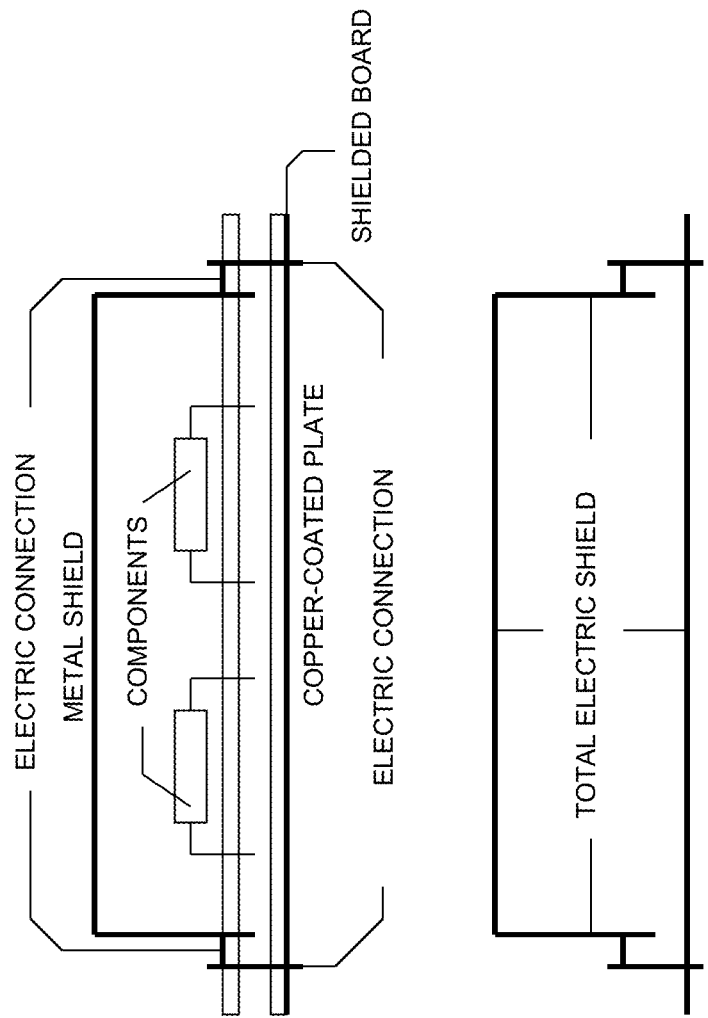
FIGS. 12A and 12B are schematic cross-section views of a shielding structure according to a preferred embodiment.

Finally, in FIGS. 12A and 12B the mechanical shielding structure of the electronic unit according to the invention is schematically illustrated.

As a matter of fact, when, in an amplification circuit, high input impedance and a significant voltage/charge ratio coexist, it is necessary to accomplish an effective shielding from external electromagnetic fields.

The shielding is obtained by the joint action of a metal cover (of tin-plated iron, for example with a parallelepipedal shape), which fully covers the electronic circuit on the upper side, and a copper-coated plate on the lower side thereof. The two shieldings are electrically connected with each other for accomplishing a sort of full shielding, similar to a Faraday cage.

Both in order to improve the mechanical binding of the connection cables with the elements outside the electronic circuit, and to add a further shielding precisely in correspondence of the welding points of the cables coming from the transducers, a small-sized copper-coated plate is added which, through a tab of elastic material, pushes the initial part of the connecting cables with the printed board of the circuit.

As can be guessed from the above-reported description, with the solution of the invention it is possible to achieve a certain number of advantageous results over the prior art.

Due to the particular input circuit in a "charge amplifier" configuration, there is the opportunity to mutually connect in parallel multiple sound transducers, without altering the response thereof. At least one of the two input circuits can be configured, both as a charge amplifier and also as a non-inverting amplifier with high input impedance, perfectly adapted also as preamplifier for different-type transducers such as microphones, magneto-dynamic or variable-reluctance transducers.

Power supply to the device may be accomplished in different ways: local battery with voltages ranging between 6 and 24 Volt, or single or dual (symmetrical or asymmetrical) remote power supply with overall voltage values ranging between 6 and 24 Volt, or power supply with "Phantom" technique for exploiting all the apparatuses which are provided therewith.

The output stage is active and at low impedance and is hence able to correctly drive any reasonable load consisting of the outer amplifier and of the shielded connecting cable. The output connector allows to accomplish a differential-type connection, so as to obtain a high immunity from frequency disturbances of the mains.

Finally, the mechanical structure of the envelope of the electronic unit is accomplished by combining electric shielding and magnetic shielding, such as to represent an effective electro-magnetic shielding case.

With the amplification structure according to the invention significant advantages over the prior art are achieved.

Due to the charge amplifier circuit of the invention, in the form of operational amplifier fed-back through a capacity, the actual transduction charge→voltage is obtained which cannot be obtained with circuits of the type FET impedance adapter follower. Moreover, with the solution described by the invention, the sensor operating at virtually null voltage, there is the opportunity of mutually connecting in parallel multiple piezoelectric sensors, maintaining unaltered the charge→voltage function for each one of the sensors, without any variation with respect to the connection of any individual sensor.

However, it is understood that the invention is not limited to the particular configurations illustrated above, which make up only non-limiting examples of the scope of the invention, but that a number of variants are possible, all within the reach of a person skilled in the field, without departing from the scope of the invention.

For example, although in the description reference has always been made to a guitar, the system of the invention can be advantageously applied also to other string instruments, such as violins, cellos, but also other instruments with vibrating parts such as xylophones, vibraphones and percussions in general.

The invention claimed is:

1. A sound detection system of a musical instrument with vibrating parts, comprising:
   at least a pair of sensors comprised of at least
   i) a first sensor comprised of a piezoelectric transducer in a first channel that picks up a first signal, and
   ii) a second sensor comprised of a sensor transducer in a second channel that picks up a second signal that is independent from the first signal, the second sensor free of any piezoelectric transducer; and
   a preamplification unit for processing a signal output from the first sensor in the first channel and a signal output from the second sensor in the second channel,
   wherein said preamplification unit comprises
   i) a first amplifier connected to the signal output of the first sensor, a first equalization stage comprising a first RC circuit connected to an output of the first amplifier, and a first variable weighted adder circuit with a first volume control having an arbitrary logarithmic response curve and comprised of a first resistive trimmer that sets a maximum gain value for the first channel, the first amplifier being a charge amplifier of fixed input impedance,
   ii) a second amplifier connected to the signal output of the second sensor, a second equalization stage comprising a second RC circuit connected to an output of the second amplifier, and a second variable weighted adder circuit with a second volume control having an arbitrary logarithmic response curve and comprised of a second resistive trimmer that sets a maximum gain value for the second channel, the second amplifier being a charge amplifier or a non-inverting amplifier having high input impedance, wherein the first equalization stage has a first structure that provides a first frequency response, and the second equalization stage has a second structure that provides a second frequency response different from the first frequency response, iii) an adder connected to an output of the output of the first variable weighted adder circuit and to an output of the a second variable weighted adder circuit, and iv) an output stage connected to an output of the adder.

2. The system as in claim 1, wherein,
said second sensor comprised of a sensor transducer is an accelerometric, and
said second equalization stage comprises an analogic, almost integrator circuit, consisting of an active circuit with pole+zero response.

3. The system as in claim 1, wherein a volume adjuster is provided, for each channel, with logarithmic adjusting curve, accomplished with a potentiometer circuit (P1) with linear variation curve and a load consisting of a resistance (R18) arranged between a cursor of the potentiometer (P1) circuit and a reference.

4. The system as in claim 3, wherein the ratio between the value of the potentiometer circuit (P1) and the resistance (R18) circuit lies in the range between 3 and 5, so as to obtain an adequate logarithmic-type variation curve.

5. The system as in claim 1, wherein said output stage is balanced with the provision of an inverting amplifier stage with unitary gain (U4, R24, R25, C22) cascading with said output stage integrated in said adder amplifier (U3).

6. The system as in claim 1, wherein said piezoelectric transducer is thin and with a self-shielding structure from external electric fields and configured to be arranged below a bridge of said musical instrument being a string musical instrument.

7. The system as in claim 1, wherein said sensor transducer of the second sensor is accelerometric, of a mass below 1 g and repositionable in any location of the instrument and fastened there by low-tenacity (pressure sensitive) adhesive.

8. The system as in claim 7, wherein said accelerometric transducer is configured to be rotated by 180°, so as to be able to obtain a signal phase displacement by 180° when interference conditions arise with elision of the signals coming from the first and second sensors.

9. The system as in claim 1, wherein the signals coming from the first and second sensors are mixed with an arbitrary ratio, being able to come also to the full exclusion of either one of the two transducers.

10. The system as in claim 1, wherein components making up said preamplification unit are substantially contained in an electrically and magnetically shielded envelope.

11. The system as in claim 2, wherein a volume adjuster is provided, for each channel, with logarithmic adjusting curve, accomplished with a potentiometer circuit (P1) with linear variation curve and a load consisting of a resistance (R18) arranged between a cursor of the potentiometer (P1) circuit and a reference.

12. The system as in claim 2, wherein said piezoelectric transducer is thin and with a self-shielding structure from external electric fields and configured to be arranged below a bridge of said stringed musical instrument.

13. The system as in claim 3, wherein said piezoelectric transducer is thin and with a self-shielding structure from external electric fields and configured to be arranged below a bridge of said stringed musical instrument.

14. The system as in claim 4, wherein said piezoelectric transducer is thin and with a self-shielding structure from external electric fields and configured to be arranged below a bridge of said stringed musical instrument.

15. The system as in claim 5, wherein said piezoelectric transducer is thin and with a self-shielding structure from external electric fields and configured to be arranged below a bridge of said stringed musical instrument.

16. The system as in claim 2, wherein said sensor transducer of the second sensor is accelerometric, of a mass below 1 g and repositionable in any location of the instrument and fastened there by low-tenacity (pressure sensitive) adhesive.

17. The system as in claim 3, wherein said sensor transducer of the second sensor is accelerometric, of a mass below 1 g and repositionable in any location of the instrument and fastened there by low-tenacity (pressure sensitive) adhesive.

18. The system as in claim 1, wherein said second amplifier is the non-inverting amplifier with high input impedance.

19. The system as in claim 1, wherein said second amplifier is the charge amplifier.

20. The system as in claim 1, wherein,
said sensor transducer of the second sensor another type is a magnetic transducer, and
said second equalization stage comprises an analogic, almost integrator circuit, consisting of an active circuit with pole+zero response.

* * * * *